(12) United States Patent
Galvanauskas et al.

(10) Patent No.: US 8,107,167 B2
(45) Date of Patent: Jan. 31, 2012

(54) SPATIAL-DISPERSION-FREE SPECTRAL COMBINING OF PULSED HIGH PEAK POWER FIBER LASER BEAMS

(75) Inventors: Almantas Galvanauskas, Ann Arbor, MI (US); Kai-Chung Hou, San Diego, CA (US)

(73) Assignee: The Regents of The University of Michigan, Ann Arbor, MI (US)

( * ) Notice: Subject to any disclaimer, the term of this patent is extended or adjusted under 35 U.S.C. 154(b) by 434 days.

(21) Appl. No.: 12/435,399

(22) Filed: May 4, 2009

(65) Prior Publication Data

US 2010/0277804 A1 Nov. 4, 2010

(51) Int. Cl.
*G02B 27/10* (2006.01)
*H04J 14/02* (2006.01)
*H04B 10/18* (2006.01)

(52) U.S. Cl. .......... 359/583; 359/857; 359/333; 398/81; 398/85

(58) Field of Classification Search ............. 359/484.07, 359/491.01, 489.19, 583; 398/81, 83–85, 398/87
See application file for complete search history.

(56) References Cited

U.S. PATENT DOCUMENTS

| | | | | |
|---|---|---|---|---|
| 2,604,813 | A * | 7/1952 | Gretener | 353/32 |
| 4,174,150 | A | 11/1979 | Congleton | |
| 4,395,090 | A * | 7/1983 | Mahlein | 359/586 |
| 4,405,199 | A * | 9/1983 | Ogle et al. | 398/212 |
| 4,655,547 | A * | 4/1987 | Heritage et al. | 359/563 |
| 4,709,144 | A * | 11/1987 | Vincent | 250/226 |
| 4,765,715 | A * | 8/1988 | Matsudaira et al. | 359/583 |
| 4,823,357 | A | 4/1989 | Casey | |
| 5,119,454 | A * | 6/1992 | McMahon | 385/49 |
| 5,179,462 | A | 1/1993 | Kageyama et al. | |
| 5,263,039 | A * | 11/1993 | Skupsky et al. | 372/25 |
| 5,416,624 | A * | 5/1995 | Karstensen | 398/139 |
| 5,463,494 | A * | 10/1995 | Hobrock | 359/359 |
| 5,812,291 | A * | 9/1998 | Bendelli et al. | 398/85 |
| 5,822,095 | A * | 10/1998 | Taga et al. | 398/85 |
| 5,920,411 | A * | 7/1999 | Duck et al. | 398/85 |
| 6,008,920 | A * | 12/1999 | Hendrix | 398/79 |
| 6,067,178 | A * | 5/2000 | Zheng | 398/1 |
| 6,101,037 | A * | 8/2000 | Park et al. | 359/618 |

(Continued)

FOREIGN PATENT DOCUMENTS

EP 0325362 A2 7/1989

(Continued)

OTHER PUBLICATIONS

Anderegg, et al. "Coherently coupled high-power fiber arrays," Proc. SPIE 6102, 61020U (2006).

(Continued)

*Primary Examiner* — Mark Hellner
*Assistant Examiner* — Ari M Diacou
(74) *Attorney, Agent, or Firm* — Marshall, Gerstein & Borun LLP

(57) ABSTRACT

A beam combining system suitable of pulsed fiber laser applications is able to produce non-spatial-dispersive beams using an highly efficient filter, such as a multilayer dielectric filter, in transmission and reflection configurations. The techniques therefore can overcome constraints on laser line-width and beam width and allow for more stable systems for high peak power pulsed laser energy, such as may be used in extreme ultraviolet lithography and other applications.

15 Claims, 18 Drawing Sheets

U.S. PATENT DOCUMENTS

| | | | |
|---|---|---|---|
| 6,292,282 B1* | 9/2001 | Mossberg et al. | 398/99 |
| 6,292,298 B1* | 9/2001 | Glance | 359/583 |
| 6,449,039 B1* | 9/2002 | Bouzid | 356/318 |
| 6,665,320 B1* | 12/2003 | Arbore et al. | 372/20 |
| 6,711,311 B2* | 3/2004 | Delisle et al. | 385/11 |
| 6,816,326 B2* | 11/2004 | Nattermann et al. | 359/822 |
| 6,819,871 B1* | 11/2004 | Baldwin et al. | 398/85 |
| 6,876,679 B1 | 4/2005 | Bowler et al. | |
| 6,934,069 B2* | 8/2005 | Moon et al. | 359/290 |
| 7,127,139 B2* | 10/2006 | Onaka et al. | 385/37 |
| 7,180,670 B2* | 2/2007 | Tempea et al. | 359/584 |
| 7,199,924 B1* | 4/2007 | Brown et al. | 359/556 |
| 7,233,442 B1* | 6/2007 | Brown et al. | 359/556 |
| 7,280,570 B2 | 10/2007 | Seyfried et al. | |
| 7,319,560 B2* | 1/2008 | Gunning et al. | 359/578 |
| 7,436,588 B2* | 10/2008 | Rothenberg et al. | 359/349 |
| 7,535,631 B2* | 5/2009 | Brown et al. | 359/341.1 |
| 2001/0036330 A1* | 11/2001 | Delisle et al. | 385/11 |
| 2002/0018298 A1* | 2/2002 | Miller et al. | 359/583 |
| 2003/0030876 A1* | 2/2003 | Takei | 359/187 |
| 2004/0008427 A1* | 1/2004 | Nattermann et al. | 359/796 |
| 2004/0227986 A1* | 11/2004 | Kurz et al. | 359/328 |
| 2005/0018960 A1* | 1/2005 | De Bougrenet De La Tocnaye et al. | 385/27 |
| 2005/0058175 A1* | 3/2005 | Gross et al. | 372/98 |
| 2005/0226286 A1* | 10/2005 | Liu et al. | 372/25 |
| 2006/0071143 A1* | 4/2006 | Saggau et al. | 250/201.3 |
| 2007/0019276 A1* | 1/2007 | Zeng et al. | 359/285 |
| 2009/0153968 A1* | 6/2009 | Goodno | 359/571 |
| 2009/0196599 A1* | 8/2009 | Konishi | 398/7 |
| 2009/0219610 A1* | 9/2009 | Mourou et al. | 359/341.1 |
| 2010/0053743 A1* | 3/2010 | Galimberti et al. | 359/385 |
| 2010/0182712 A1* | 7/2010 | Chinnock | 359/890 |

FOREIGN PATENT DOCUMENTS

| | | |
|---|---|---|
| EP | 0494767 A2 | 7/1992 |

OTHER PUBLICATIONS

Augst, et al. "Beam combining of ytterbium fiber amplifiers (Inverted)," J. Opt. Soc. Am. B 24, 1707-1715 (2007).

Augst, et al. "Coherent beam combining and phase noise measurements of ytterbium fiber amplifiers," Opt. Lett. 29, 474-476 2004.

Augst, et al. "Wavelength beam combining of ytterbium fiber lasers," Opt. Lett. 28:331-333 (2003).

Brandt, et al. "LPP EUV source development for HVM," Proc. SPIE 6517:1-10 (2007).

Brooks, et al., "Multimegawatt peak-power, single-transverse-mode operation of a 100 μm core diameter, Yb-doped rodlike phtonic crystal fiber amplifier," Appl. Phys. Lett. 89:111-119 (2006).

Canova, et al., "High-efficiency, broad band, high-damage threshold high-index gratings for femtosecond pulse compression," Opt. Express 15:15324-15334 (2007).

Ciapurin, et al. "Spectral combining of high-power fiber laser beams using Bragg grating in PTR glass," Proc. SPIE Int. Soc. Opt. Eng. 5335:116 (2004).

Fan, T.Y., "Laser beam combining for high-power, high-radiance sources," Selected Topics in Quantum Electronics, IEEE Journal of, 11(3):567-577 (2005).

Galvanauskas, et al., "High Peak Power Pulse Amplification in Large-Core Yb-Doped Fiber Amplifiers", IEEE J. Sel. Top. Quantum Eletron. 13:559-566 (2007).

George, et al. "13.5 nm EUV generation from tin-doped droplets using a fiber laser," Opt. Express 15:16348-16356 (2007).

He, et al., "Optimisation of cascaded Yb fiber amplifier chains using numerical-modelling," Opt. Express 14:12846-12858 (2006).

Hou, et al., "High power fiber laser driver for efficient EUV lithography source with tin-doped water droplet targets," Opt. Express 16:965-974 (2008).

Huo, et al. "Fundamental mode operation of a 19-core phase-locked Yb-doped fiber amplifier," Opt. Express 12:6230-6239 (2004).

Höfer, et al. "100-w average-power, high-energy nanosecond fiber amplifier," Applied Physics B: Lasers and Ostics, 75(4):477-479 2002.

Ishaaya, et al. "Coherent addition of spatially incoherent light beams," Opt. Express 12, 4929-4934 (2004).

Klingebiel, et al. "Spectral beam combining of Yb-doped fiber lasers with high efficiency," J. Opt. Soc. Am. B 24, 1716-1720 (2007).

Li et al., "Phase locking and in-phase supermode selection in monolithic multicore fiber lasers," Opt. Lett. 31:2577-2579 (2006).

Limpert, et al., "The Rising Power of Fiber Lasers and Amplifiers," IEEE Journal of Selected Topics in Quantum Electronics, 13(3):537-545 (2007).

Loftus, et al. "Spectrally Beam-Combined Fiber Lasers for High-Average-Power Applications," Selected Topics in Quantum Electronics, IEEE Journal of, vol. 13(3): 487-497 (2007).

Mafi et al. "Phase locking in a passive multicore photonic crystal fiber," J. Opt. Soc. Am. B 21:897-902 (2004).

Michaille, et al. "Phase locking and supermode selection in multicore photonic crystal fiber lasers with a large doped area," Opt. Lett. 30:1668-1670 (2005).

Schrader, et al., "High-Power fiber amplifier with widely tunable repetition rate, fixed pulse duration, and multiple output wavelengths," Opt. Express 14:11528-11538 (2006).

Semrock, RazorEdge® Raman Filters—Common Specifications, http://www.semrock.com/Catalog/RamanEdgeFilter_CommonSpecs.htm.

Stewart, et al. "Ion beam sputtering of optical coatings," Proc. SPIE Int. Soc. Opt. Eng. 2114:662 (1994).

Stuart, et al., "Optical ablation by high-power short-pulse lasers," J. Opt. Soc. Am. B, 13(2):459 (1996).

Wrage, et al. "Phase locking in a multicore fiber laser by means of a Talbot resonator," Opt. Lett. 25:1436-1438 (2000).

Wu e al., "Extreme ultraviolet lithography: A review," Journal of Vacuum Science & Technology B: Microelectronics and Nanometer Structures, 25(6):1743-1761 (2007).

* cited by examiner

SPATIAL-DISPERSION-FREE SPECTRAL COMBINING OF PULSED HIGH PEAK POWER FIBER LASER BEAMS

BACKGROUND OF THE DISCLOSURE

1. Field of the Disclosure

The disclosure relates generally to beam combining techniques and, more particularly, to beam combining techniques compatible with high peak power fiber laser applications.

2. Brief Description of Related Technology

In the field of lasers, fiber laser systems enjoy particular interest due to their unique utility in certain applications. Erbium-doped fiber amplifiers (EDFA) are used commercially for long-haul optical communications and other applications that require relatively low power sources. In contrast, Nd-doped fiber lasers (NDFL) and Yb-doped fiber lasers (YDFL) are used in applications demanding high power light sources. Yb-doped fiber lasers are particularly attractive because they offer higher power conversion efficiencies and larger output power levels, due at least in part to their rather simple electron level configuration and efficient photon absorption.

There are numerous applications for high-power fiber lasers, including material processing, remote sensing, and medical applications. Recently, there has been interest in extreme-ultraviolet (EUV) lithography, which is a next-generation lithography technique offering significant reduction in wavelengths compared to current lithography techniques. EUV lithography which uses 13.5 nm wavelengths offers an ability to form much smaller-sized features over current semiconductor design techniques.

Researchers have created some high-power laser-produced-plasma (LPP) EUV sources operating at 13.5 nm. Generally speaking, however, it is difficult to develop a fiber laser source at EUV energies, because the projected power levels needed (~25 kW) are too great. Some have demonstrated all-fiber-based megawatt (MW) peak-power amplifiers to be feasible candidates for an efficient EUV generation. However, to achieve the required power for a LPP-EUV-source, as would be required for lithography stepper machines, multiple laser beams would have to be combined using what are called beam combining techniques.

Current laser beam combining techniques include technologies using spectral beam combining (SBC) and coherent beam combining (CBC). State of the art beam combining systems, for example, have been shown to produce a combined power of 522 W using SBC and combined power of 470 W using CBC. Between the two, the SBC technique appears to be most desired due to perceived robustness and relative simplicity of implementation.

Current SBC techniques, however, are based on spatial-spectral-dispersion combining-elements, i.e., diffraction gratings, that superimpose beams of different optical wavelengths to form the combined, high-power beam. For these types of combining-elements, there exists a limitation on laser spectral-width and beam-size that must be maintained to retain sufficient mode quality on a combined-beam. This limitation is a principal problem for fiber-lasers with MW-peak-power due to nonlinear-induced spectral-broadening. Beyond these spectral-width and beam size limitations, existing grating-based combining-elements are unable to withstand operation at optical powers of 25 kW, because of thermal-induced wave-front distortion at such high power levels.

As noted above, one limitation of conventional spectral combining techniques is the inherent trade-off between signal spectral width on each laser channel and the maximum allowable beam size on the combining element. This trade-off fundamentally originates in the fact that a finite spectral linewidth corresponds to a finite amount of the spectral divergence of the signal beam at the output of the combining element. Since divergence of an optical beam due to diffraction is inversely proportional to the beam spot size, the combined beam should have a spot size that is small enough such that beam divergence resulting from diffraction dominates over the beam divergence resulting from spatial spectral dispersion. That is, the combined beam should have a spot size such that the quality of the laser beam is not affected by spatial spectral dispersion. For a diffraction grating this trade-off between the allowable beam spot size is expressed as:

$$\Delta\lambda \cdot \omega_0 = \frac{2\sqrt{(M^2)^2 - 1} \cdot c \cdot \cos(\alpha_0)}{g\lambda\pi} \quad (1)$$

where $\Delta\lambda$ is the linewidth in Hz, $\omega_0$ is the beam width in mm, $M^2$ is the beam quality of the combined output beam (diffraction-limited beams incident onto the grating are assumed), c is the speed of light, $\alpha_0$ is the incident angle of the grating (usually equal to the Littrow angle), and g is the grating groove density in lines/mm.

FIG. 1(a) illustrates the tradeoff between linewidth and beam width for a near-diffraction-limited output beam ($M^2$=1.2~1.5) using a diffraction grating combiner with a 1064 nm wavelength, 1740 lines/mm grating and a Littrow angle ~66°, which are the same parameters as typically used for SBC.

The general practical constraint that this trade-off imposes on a fiber laser based spectral-combining system is two-fold. First, because each laser channel has to operate within a very narrow spectral linewidth, spectral broadening due to fiber nonlinearities (e.g., stimulated Brillouin scattering (SBS) for continuous wave (cw) signals or self-phase modulation (SPM) for pulsed signals) severely restricts the power one can achieve per laser channel. Second, because the beam spot size on a combining grating is limited, the potential for high thermal loading and optical grating damage limits the total combined power that one can achieve. Overcoming these constraints would require use of a very large number of laser channels, as well as the development of new grating technologies that are resistant to very high optical power densities.

Pulsed laser applications are particularly limited because of the spectral broadening that results from SPM. This SPM induced broadening severely limits spectral linewidths that could be made available for a multi-stage MW-peak-power Yb-doped fiber amplifier. Assuming a bandwidth-limited Gaussian pulse injected into a cascaded n-stage fiber amplifier system, where each stage is characterized by a different gain, core size and length, one can express the overall spectral broadening ($\delta\omega_{max}$) in the system as:

$$\delta\omega_{max} = \sum_{i=1}^{n} 0.86 T_0^{-1} \frac{2\pi n_2}{\lambda A_{eff(i)}} P_i \frac{1 - \exp(g_i L_i)}{g_i} \quad (2)$$

where n is the number of amplifier stages, $T_0$ is the initial pulse duration, $n_2$ is the nonlinear refractive index ($3.2 \times 10^{-20}$ m²/W for fused silica), $\lambda$ is the wavelength of the signal, and $A_{eff(i)}$, $P_i$, $g_i$ and $L_i$ are the effective core area, input peak power, gain and length for the i-th amplification stage, respectively. As an example, consider a high peak power narrow-linewidth pulsed system using a 100 μm core photonic-crystal rod waveguide as the last amplification stage (see, e.g., Brooks and Teodoro, "Multinnegawatt peak-power, single-transverse-mode operation of a 100 μm core diameter. Yb-doped rodlike photonic crystal fiber amplifier," Appl. Phys. Lett. 89, 111119 (2006)). Such a large core significantly exceeds the fiber core sizes achieved in practical fiber lasers, and, therefore, provides an upper-limit estimate for detrimental nonlinear effects in a pulsed fiber amplifier. With the system architecture and parameters provided by Brooks and Teodoro, "Multimegawatt peak-power, single-transverse-mode operation of a 100 μm core diameter, Yb-doped rodlike photonic crystal fiber amplifier," and assuming equal gain for each stage with 3 dB of inter-stage loss (due to the optical isolators, filters and coupling losses) Expression (2) gives ~18 GHz of SPM-induced spectral broadening for MW peak power and 1 ns duration pulses at the system output. This is consistent with the experimental data reported. For longer pulse durations SPM is no longer the dominant nonlinearity. Instead, our analysis and experimental data indicates that for pulse durations of a few nanoseconds and longer, four-wave-mixing and stimulated Raman scattering become the limiting factors, not SPM.

In any event, this analysis demonstrates that even using the maximum-size fiber cores extraction of the highest (MW peak) power pulses results in a minimum spectral width of an amplified signal in the range of 10's of GHz or larger. FIG. 1a shows that for lasers with tens of GHz of linewidth, a beam radius less than 1 mm is required, which would result in a very high power density on a combining grating. In particular, FIG. 1a shows that for such linewidths to achieve a diffraction-limited ($M^2<1.2$) combined beam requires a spot size diameter on the combining grating to be in the range of 2-3 mm or smaller. With that beam size, one can only combine up to ~25 mJ of ns-pulses by gold-coated gratings, given their reported damage threshold of ~0.8 J/cm$^2$ for 1-ns pulses. Dielectric diffraction-gratings have a higher damage threshold, up to 4.4 J/cm$^2$ for 5-ns pulses, giving a maximum combined energy ~138 mJ. However, the power density even for a 5-kW combined power can reach ~160 kW/cm$^2$ on the dielectric grating, and this power density will lead to waveform distortion. FIG. 1b plots the power density as a function of the beam radius for the targeted combining power 5 kW, 25 kW and 100 kW (with Littrow incident angle). The plots provide a power density of ~1294 kWm/cm$^2$ for 100 kW with a 1 mm radius beam, for example. These intensity levels will create thermal-induced wavefront distortion, and very likely, thermal damage on conventional grating-based beam combining systems.

In light of the limitations with conventional schemes, spectral combining schemes that operate without spatial-spectral-dispersion are desirable, especially if one hopes to use beam combining techniques with fiber-lasers capable of producing MW peak-power and multi-kW of average power.

SUMMARY OF THE DISCLOSURE

To overcome the heretofore inherent limitations preventing the use of fiber lasers sources in beam combining applications, the present application describes techniques based on non-spatial-dispersive SBC that use filter elements able to withstand high optical power densities, while maintaining high efficiency. The techniques may be used to produce combined beams of desired pulse width and beam spot size. While the application is not limited to particular filters, one desirable class of filters is multilayer-dielectric (MLD) filters. The disclosed SBC methods using MLD filters offer a solution for combining high-peak-power fiber laser with broad spectral bandwidth. With them, high average power can be realized using large beam-width on the combining element without thermal damage or wavefront distortion. The techniques provided herein eliminate the constraint on laser linewidth and beam width held by conventional spectral-dispersive SBC, thus enabling one for the first time to combine high peak power and high average power beams from an array of fiber lasers. Using these techniques fiber-laser systems with a 25 kW combined-power may now be designed, for EUV lithography applications as well as others.

The techniques may be implemented with only a few combining stages and maintaining high efficiency, high optical power density combined beams. In one example, combining three beams from spectrally-broad pulsed-fiber-amplifiers into a single spatially-overlapped beam resulted in a combined-beam having a beam quality of $M^2$~1.86, and greater than 91% combining efficiencies, 52 W of combined power and 4.0-mJ of combined energy.

The techniques are adaptable to various applications, including EUV lithography, and part of that adaptability is the result of being able to use large number of combining stages while still maintaining an overall high efficiency. By using large numbers of highly efficient combining stages, large numbers of laser output channels each at different wavelengths may be combined. Effectively, this means that less power can be used in each stage, while producing a combined beam with the high power level desired by many applications. For example, ~40 laser channels were combined with 90% overall efficiency with the measured characteristics of the filter sample; and much higher channel density is possible with even better filter characteristics. A number of factors will affect how many laser channels are to be combined, including the desired output power of the combined beam, the desired spectral bandwidth on the combined beam, the channel bandwidth spacing, as well as the efficiency of the combining filters and combining stages being used.

In accordance with one aspect of the disclosure, an apparatus for forming a spatial non-dispersive beam includes: a plurality of pulsed laser sources, each laser source is to produce a pulsed laser beam at a different wavelength where each pulsed laser beam has a peak power of above 0.5 kW, and where each pulsed laser beam is spatially dispersed from the other pulsed laser beams; and a beam combiner apparatus having a plurality of spatial dispersion-correcting stages one for each of the pulsed laser beams, where each spatial dispersion-correcting stage is tuned to transmit and reflect incident light using a different spatial-domain transmission profile from the other spatial dispersion-correcting stages, where the spatial dispersion-correcting stages are configured to combine the pulsed laser beams along a propagation path in a wavelength-independent manner by removing the spatial dispersion from the pulsed laser beams and in a temporally synchronized manner to produce the spatial non-dispersive beam as a combined pulsed output beam from the beam combiner apparatus, the spatial non-dispersive beam having a spectral profile that spans the different wavelengths of the pulsed laser beams and having a peak power that is proportional to a combined peak power of the pulsed laser beams.

In accordance with another example, a method of forming a spatially non-dispersive beam, includes: producing a plurality of pulsed laser beams, each laser beam is at a different wavelength from the other laser beams and each has a peak power of above 0.5 kW, wherein the laser beams are spatially dispersed from one another; and coupling the laser beams through a plurality of spatial dispersion-correcting stages one for each of the laser beams, where each spatial dispersion-correcting stage is tuned to transmit and reflect incident light using a different spatial-domain transmission profile from the other spatial dispersion-correcting stages, where the spatial dispersion-correcting stages are configured to combine the pulsed laser beams along a propagation path in a wavelength-independent manner by removing the spatial dispersion from the pulsed laser beams and in a temporally synchronized manner to produce the spatial non-dispersive beam as a combined pulsed output beam from the beam combiner apparatus, the spatial non-dispersive beam having a spectral profile that spans the different wavelengths of the pulsed laser beams and having a peak power that is proportional to a combined peak power of the pulsed laser beams.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1A:
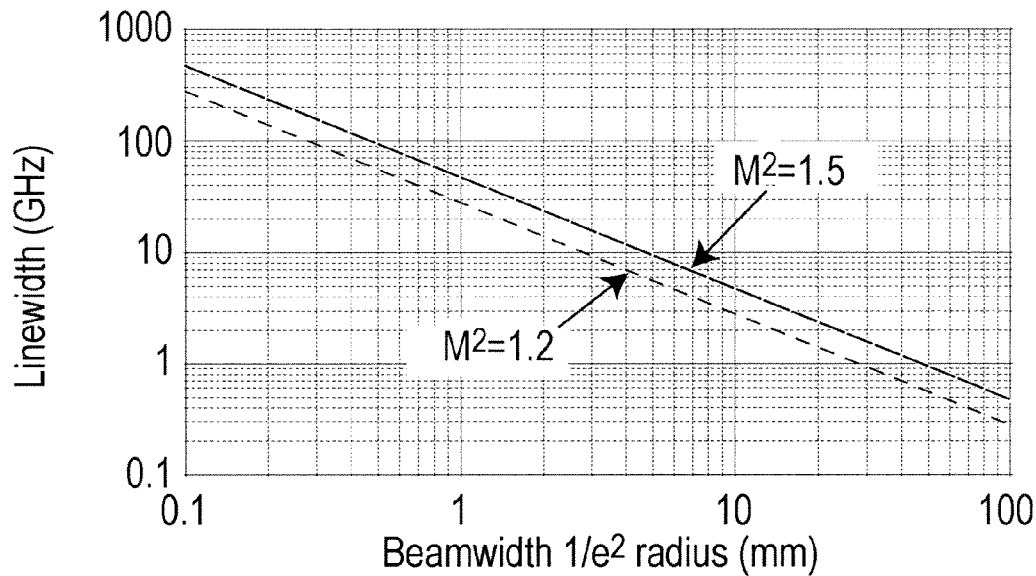
FIG. 1a is a plot of beamwidth versus linedwidth using a diffraction grating beam combiner.
Figure 1B:
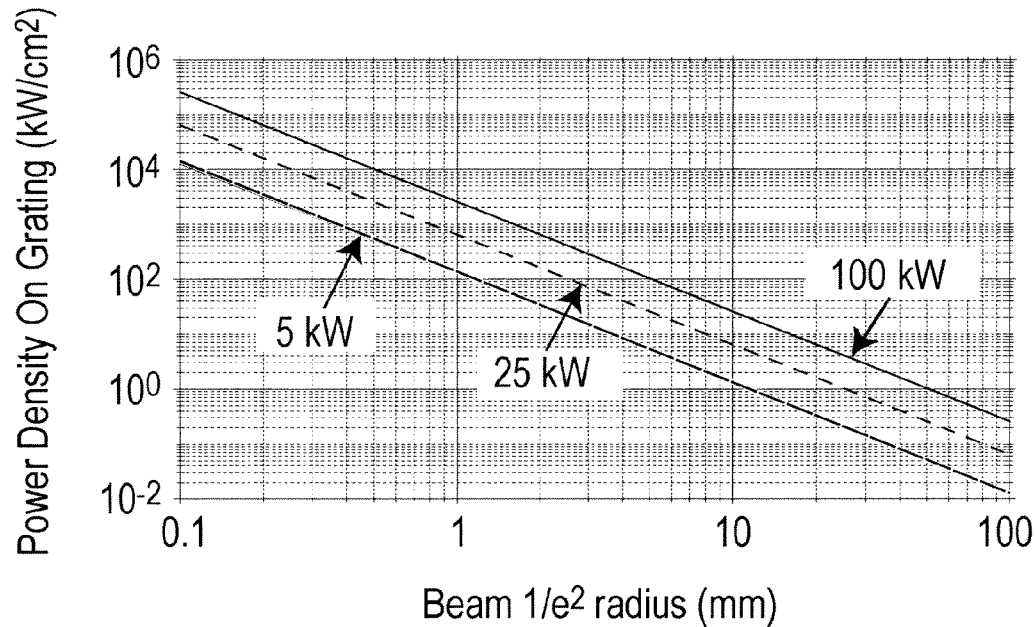
FIG. 1b is a plot of beam radius versus power density for different targeted peak powers on combined beams.

While the disclosed methods and apparatus are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

In some specific examples, spatially-dispersive SBC techniques are proposed that use a high density spectral combining approach with multiple combining filter stages. In the illustrated examples. MLD filters are useful because they offer ultra-sharp spectral transition, and thus have sharp edge transmission and reflection profiles. MLD filters rely on interference effects rather than spatial dispersion and, therefore, allow dissociating combined-beam quality from laser linewidth and beam size on a combining element. Consequently, the present techniques offer the potential to significantly increase the average and peak power levels on each laser output channel, as well as to increase the average and peak power levels on the laser output beams applied to the combining filter elements.

Figure 2A:
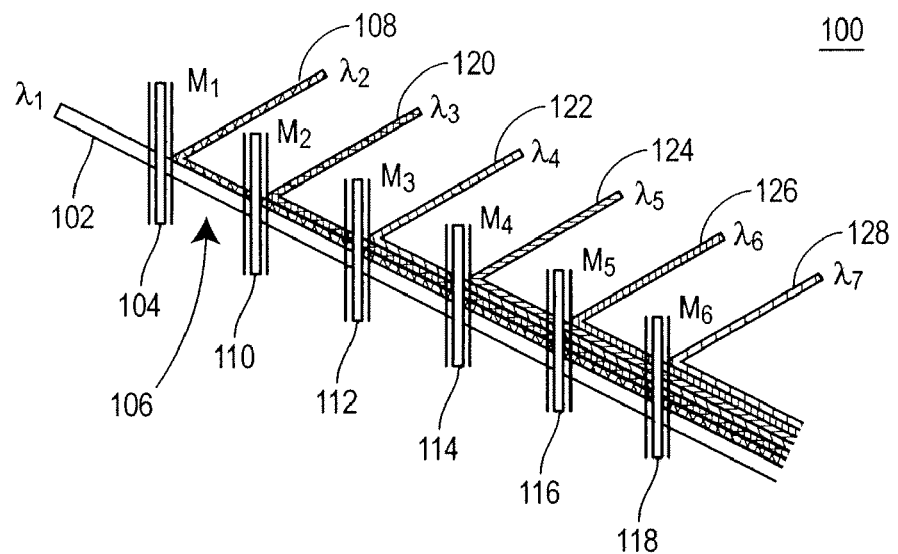
FIG. 2a illustrates a beam combiner for use in a spatially non-dispersive beam forming apparatus in a transmission configuration.
Figure 2B:
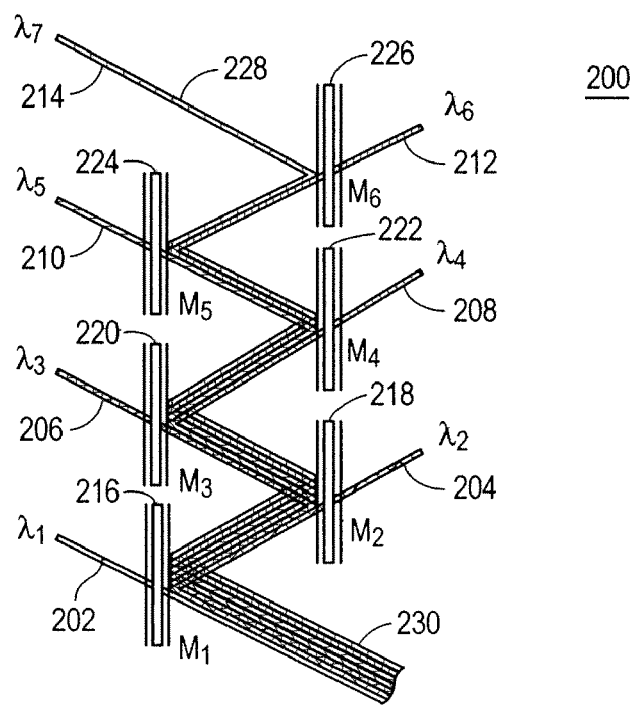
FIG. 2b illustrates a beam combiner for use in a spatially non-dispersive beam forming apparatus in a reflection configuration.

Generally, the spatially-dispersive SBC techniques for beam combining may have either a transmission filter configuration or a reflection filter configuration. FIGS. 2a and 2b illustrate these general configurations using spatial dispersion-correcting stages, each having one MLD filter associated with one laser light source (not shown). The main distinction between the two configurations is in whether the combined beam is transmitted through subsequent filters, as shown in FIG. 2a, or whether the combined beam is reflected from subsequent filters, as shown FIG. 2b. In FIG. 2a, for example, transmission configuration 100 illustrates a first pulsed laser beam 102, at a first wavelength, that is incident on a first face of a first MLD filter 104 which may filter and then pass the pulsed beam 102 propagating it along a combined beam axis 106. A second pulsed laser beam 108 is coupled to engage a second face of that filter 104, and the filter 104 couples that second pulsed beam 108 along the beam axis 106. That is, the beams 102 and 108 are combined spatially, and as discussed further later, preferably temporarily. To facilitate the reflection and transmission characteristics to achieve this beam combining, the MLD filter 104 has a particular transmission profile, at least with respect to the beams of interest (primarily the beam 108), that results in no transmission of the pulsed beam 108 through the filter, but instead substantial reflection of the pulsed beam 108 from the filter, and along the beam axis 106. The second pulsed laser beam 108 is at a different wavelength than the laser beam 102. For example, the beam 102 may be at a first laser channel wavelength used for optical data communications, and the beam 108 may be at a second laser channel wavelength spaced from the first, e.g., using a 10 nm channel spacing scheme.

The combining process is repeated across five (5) more combining stages each having a filter (filters 110, 112, 114, 116, and 118) and an incoming, corresponding pulsed laser beam (beams 120, 122, 124, 126, and 128) each at a different wavelengths from one another. The wavelengths for the beams 102, 108, 120, 122, 124, 126, and 128 are listed $\lambda_1$-$\lambda_7$, and decrease in wavelength progressively from $\lambda_1$ as the longest wavelength to $\lambda_7$ having the shortest wavelength. The filters are labeled $M_1$-$M_6$. A fully combined beam 130 is provided at the output of the system 100. Each of the incident beams is spatially dispersed from one another, e.g., in the illustrated example the beams originate from completely different directions. The combining stages together form a beam combiner apparatus that removes the spatial dispersion of the incoming beams and combines these beams into the beam 130 in such a manner that the beam 130 is spatially non-dispersive.

FIG. 2b illustrates a reflection configuration 200 for forming a spatially non-dispersive beam from input beams 202, 204, 206, 208, 210, 212, and 214, each provided to MLD filters 216, 218, 220, 222, 224, and 226, respectively. In the reflection configuration 200, these MLD filters are primary reflective meaning that the combined beam reflects from the filters, as the beam is formed, whereas in the configuration 100, the combined beam passes through the filters. The configuration 200 has a combined beam axis 228 along which the combined pulsed laser beams are combined, but this axis 228 is reflected off the surface of each filter as beam combining takes place. One notable difference between system 100 and system 200 is that in the later the first introduced pulsed laser beam, the beam 214, corresponds to wavelength $\lambda_7$ which is the wavelength of the last pulsed beam introduced in the system 100. Corresponding, the last beam introduced in the system 200, beam 202, has a wavelength $\lambda_1$ which is the wavelength of the first beam introduced in the system 100. Like the system 100, the system 200 produces a combined beam 230.

Figure 2C:
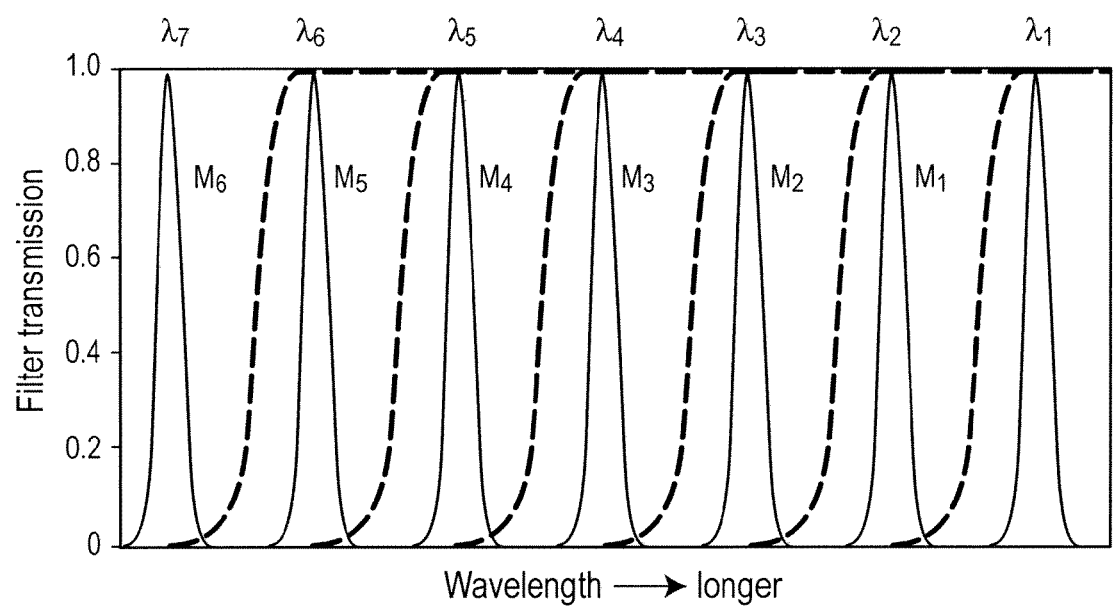
FIG. 2c is a plot of the spectral-domain profiles for multilayer dielectric filters in accordance with an example.

The spectral-domain profile (i.e., the transmission profile or reflection profile) of the filters in systems 100 and 200 are designed to facilitate the transmission and reflection characteristics generally illustrated in FIGS. 2a and 2b. FIG. 2c illustrates spectral-domain profiles for the filters in the systems 100, where each filter is identified by the markings $M_1$-$M_6$. Generally speaking, each spatial dispersion-correcting stage in a configuration may be tuned to transmit and reflect light under a different spatial-domain transmission profile. In the illustrated example, the filters $M_1$-$M_6$ each use long-wavelength pass (i.e., a high pass profile) MLD filters for spectral combining. FIG. 2c illustrates the spectral-edge positions of each MLD filter as well as spectra of each individual laser beam, i.e., laser beam channel in accordance with an example. As discussed below, the sharper the edge transition on the spatial-domain profile the tighter the allowable spacing distance (measured in nm) between channels.

This reflection configuration 200 is notable in comparison to the transmission configuration 100 in that (i) the system 200 can experience much weaker thermal distortions at high powers since a combined beam does not pass a substrate, and (ii) higher total combining efficiency can be achieved since in the vicinity of the sharp spectral transition MLD filters typically have much lower losses for a reflected beam than for a transmitted beam (see more detailed description in the next section).

To maximize combining efficiency, each laser beams' spectrum should be "sandwiched" between the spectral edges of two adjacent MLD filters entirely within a high reflection (or high transmission) region of filter characteristics and with a negligible overlap with the spectral edge regions of the profile. In the transmitting configuration, each new "downstream" channel is added on a short-wavelength side, and in the reflecting configuration each new "downstream" channel is added on a long-wavelength side with respect to "upstream" combined channels. Although the example shown here illustrates beam combining using long-pass (i.e., high-pass) filters, short-pass (i.e., low pass) filters can be used instead for both combining configurations.

Implementing a high power combined beam from pulsed laser beams presents some particular challenges, as noted. To consider the performance characteristics achievable with the MLD filter combination approach described in FIGS. 2a and 2b, a few key parameters are considered: (i) the total power combining efficiency, (ii) spectral channel density, and (iii) power/energy handling capability.

The total power-combining efficiency $\eta$ for the reflection configuration 100 shown in FIG. 2a may be expressed as:

$$\eta = \frac{1}{P_1 + P_2 + \ldots + P_N} \cdot [P_1 \cdot R_1(\lambda_1) R_2(\lambda_1) \ldots R_{N-1}(\lambda_1) + \quad (3)$$
$$P_2 \cdot T_1(\lambda_2) R_2(\lambda_2) \ldots R_{N-1}(\lambda_2) +$$
$$P_3 \cdot R_2(\lambda_3) R_3(\lambda_3) \ldots R_{N-1}(\lambda_3) + \ldots +$$
$$P_{N-1} \cdot T_{N-2}(\lambda_{N-1}) R_N(\lambda_{N-1}) + P_N T_{N-1}(\lambda_N)]$$

Here N is the total number of the combined laser channels, $P_j$ is the power of the j-th laser channel, $T_i(\lambda_j)$ and $R_i(\lambda_j)$ is the transmittance and reflectance of the i-th filter at the j-th laser channel central wavelength $\lambda_j$. Obviously, one needs N−1 filters to combine N channels. The expression is quite straightforward, since the denominator contains the total power produced by all laser channels, and the numerator has N terms, each term describing power transmission through a complete combiner setup for each corresponding laser channel. Each term is calculated by accounting for all transmission and reflection efficiencies at each MLD filter that each laser-channel beam encounters. Note that this equation is very general since it includes the fact that the power from each individual channel can be different and that the reflectance and transmittance at each filter is generally different for each laser channel depending on each filter edge position as well as laser wavelength and linewidth.

Expression (3) can be simplified by assuming that the power per laser beam (i.e., laser channel) and reflectances and transmittances (R and T, respectively) experienced by each laser beam at all filters are identical. Then the total power combining efficiency for the transmission configuration 100 is given by $$\eta^T = \frac{R(1 - T^{N-1})/(1 - T) + T^{N-1}}{N} \quad (4)$$

Efficiency for the reflection configuration 200 may be obtained from the Expression (4) by simply interchanging T and R:

$$\eta^R = \frac{T(1-R^{N-1})/(1-R)+R^{N-1}}{N} \quad (5)$$

From expressions (4) and (5) one can see that the overall combining efficiency for the transmission configuration 100 is dominated by the MLD-filter transmittance T (since each laser-channel beam is reflected once and transmitted multiple times), and for the reflection configuration 200 it is dominated by the MLD-filter reflectance R (each laser-channel beam is transmitted once and reflected multiple times).

Figure 3:
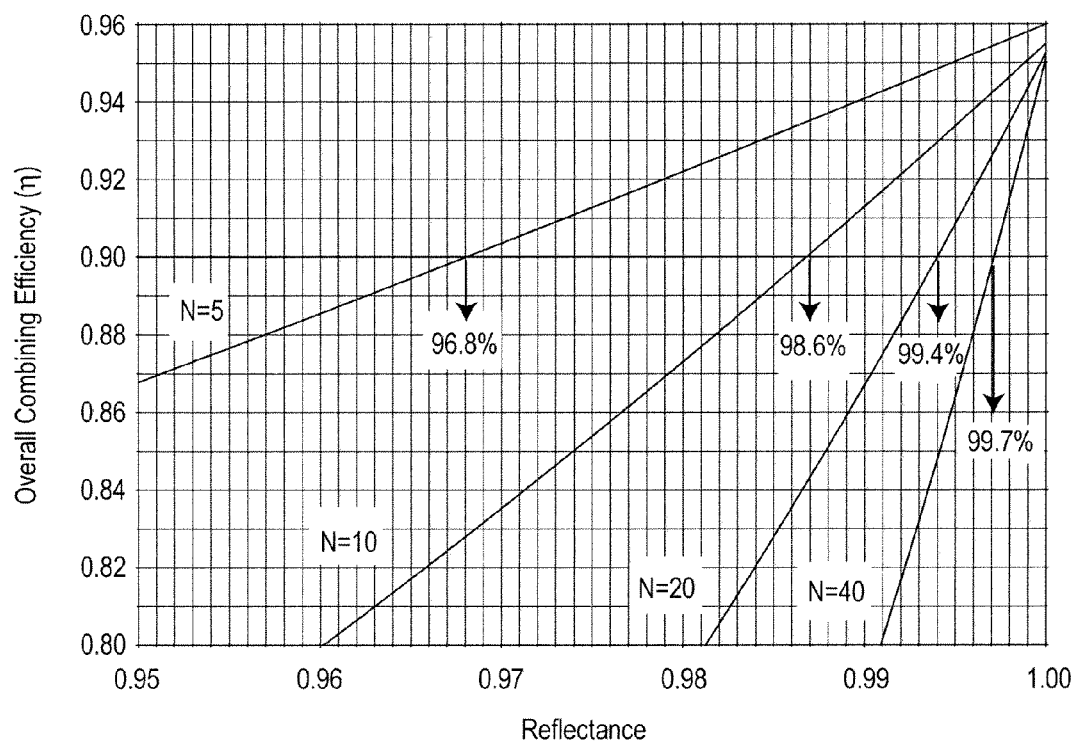
FIG. 3 is a plot of the reflectance versus overall combining efficiency on a spatially non-dispersive output beam for different numbers of spatial dispersion-correcting and laser source stages in a reflection configuration.

FIG. 3 provides an analysis of the achievable combining efficiencies for the reflection configuration 200, where the total combined-power efficiency is plotted as a function of R for different number of laser beam channels N, and thus different numbers of filters stages, N−1. T here (see expression 5) is assumed to be 95%. Clearly, the maximum achievable number of channels critically depends on the reflectance value. For example, achieving 90% total combining efficiency with 5 channels requires MLD filters with reflectance values of only 96.8%, while achieving the same efficiency with 40 channels requires much higher reflectance value of 99.7% per filter. Experimentally measured reflectance values for the MLD filters used were sufficiently high to combine ~40 channels, which is comparable to the achievable channel numbers in other SBC approaches and is more than sufficient for the majority of envisioned spectral-combining systems. The analysis in FIG. 3 is also applicable to the transmission configuration, by interchanging the T and R values.

The maximum achievable spectral channel density (or, alternatively, minimum channel spacing) is determined by the steepness of the MLD filter spectral-edge transitions on the spectral-domain profile (e.g., as shown in FIG. 2c). This, determines the number of laser channels (e.g., laser beams at different wavelengths) and combining stages available in a beam combiner. In practice, when combining pulsed beams each beam must have a certain finite (and appreciable) bandwidth, which will increase the practically achievable channel spacing. One can estimate the maximum number of laser channels $N_{max}$ using the expression $N_{max} = \Delta\lambda_{Gain}/(\Delta\lambda_F + \Delta\lambda_L)$ where $\Delta\lambda_{Gain}$ is the gain bandwidth of the laser-channel gain medium, $\Delta\lambda_F$ is the transition width of the filter (filter spectral sharpness) and $\Delta\lambda_L$ the signal maximum spectral extent for each laser channel. Considering that the MLD-filter transition can be less than ~1 nm and assuming $\Delta\lambda_L$<1-nm practical channel separations of ~2 nm should be achievable. Then considering that in Yb-doped fused-silica fibers $\Delta\lambda_{Gain}$ is ~60-80 nm, up to 30-40 Yb-doped fiber laser channels could be combined using this approach. This number approximately matches the number of combined channels estimated from the efficiency considerations described above.

Figure 4A:
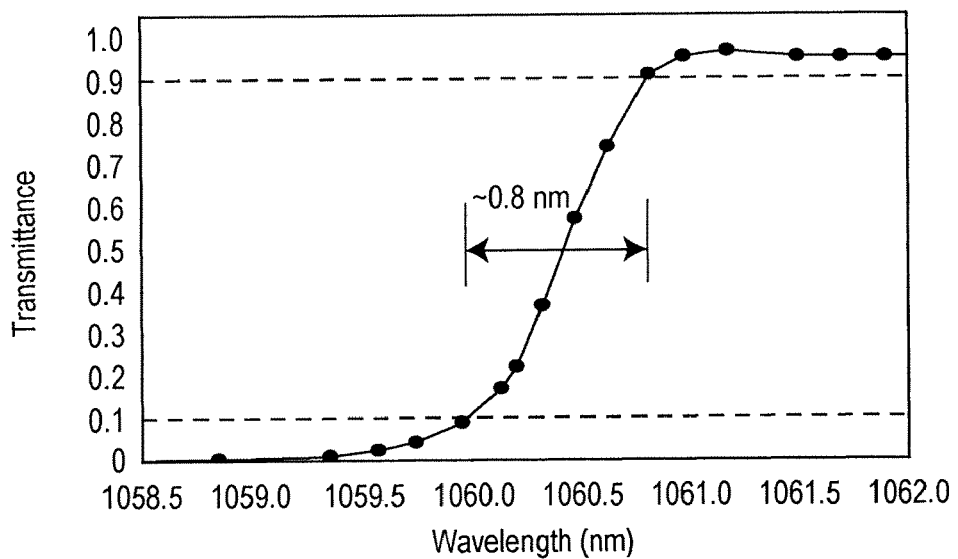
FIG. 4a is a plot of the transmittance characteristics for an example multilayer dielectric filter as a function of wavelength in accordance with an example.
Figure 4B:
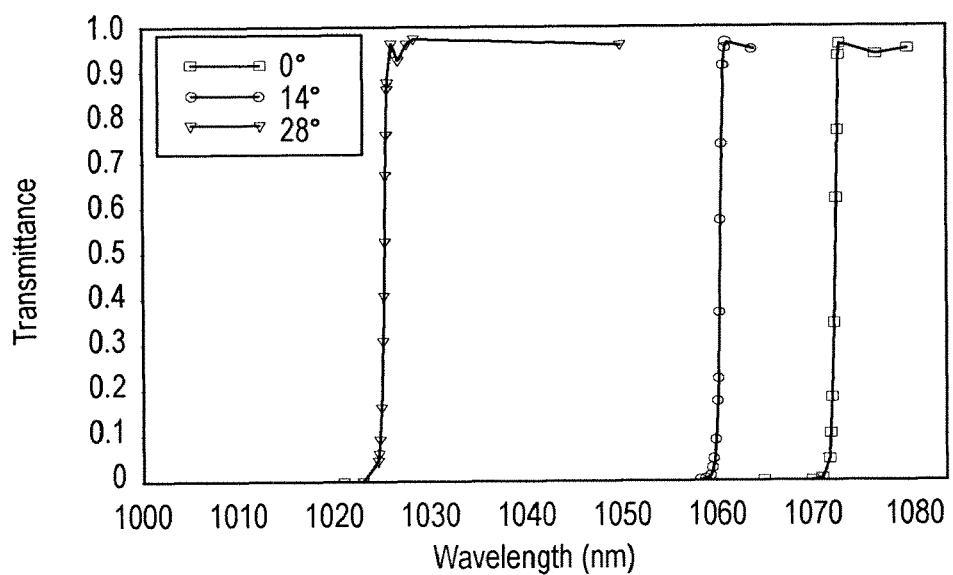
FIG. 4b is a plot of the transmittance versus wavelength for en example multilayer dielectric filter at different angles of incidence in accordance with an example.

The above outlined potential advantages of a MLD-based SBC scheme can be realized in practice only if combining filters with suitable characteristics. Detailed experimental characterization of commercially available ultra-sharp-edge long-pass filters (LPF) confirms that high-efficiency and high spectral density SBC schemes based on MLD-filter combiners are compatible with high power and high energy operation. Using a wavelength-tunable fiber laser the spectral characteristics of these devices were measured. The transmittance characteristics with a 14° incident angle are plotted in FIG. 4a, showing a transmission >95% for wavelengths longer than a cutoff wavelength and a narrow transition width ($\Delta\lambda_F$) of 0.8 nm (here, $\Delta\lambda_F$ is defined as the wavelength range between 10% transmission to 90% transmission). The cut-off wavelength is dependent on the incident angle of the laser beam and thus may be precisely tuned by altering the incident angle of the laser beam. By using angle of incidence tuning to modify the cutoff frequency and thus the spectral-domain profile of a MLD filter, the same filter material and design may be used to cover a wide spectral range. This quality of MLD filters is ideal for exploiting the large laser output bandwidths achievable using Yb-doped fiber amplifiers. FIG. 4b illustrates that a 45-nm shift in the cutoff wavelength can be realized by a moderate tuning angle of 28°, and more importantly, the measured characteristics showed no change in filter transmission or sharpness despite broad tuning.

This ability to tune the transmission/reflectance characteristics of the combining stage filters using angle of incidence tuning not only allows for use of filters of the same material, design, and fabrication. This tunability may also be automatically controllable using a closed loop control scheme. For example, a combining stage filter may be deployed on a computer controlled rotational stage that is adjustable in response to obtaining a desired spectral transmission/reflectance. That stage may be controlled by automatic means, for example, mechanical control mechanism, an electrical control mechanism, a electro-mechanical control mechanism, or a thermal control mechanism, that rotates the filter to achieve a desired spectral-domain profile for the incident beam. Alternatively, the particular desired angle of incidence may be set during assembly, for example using machine vision or various pick-and-place assembly techniques.

Figure 5:
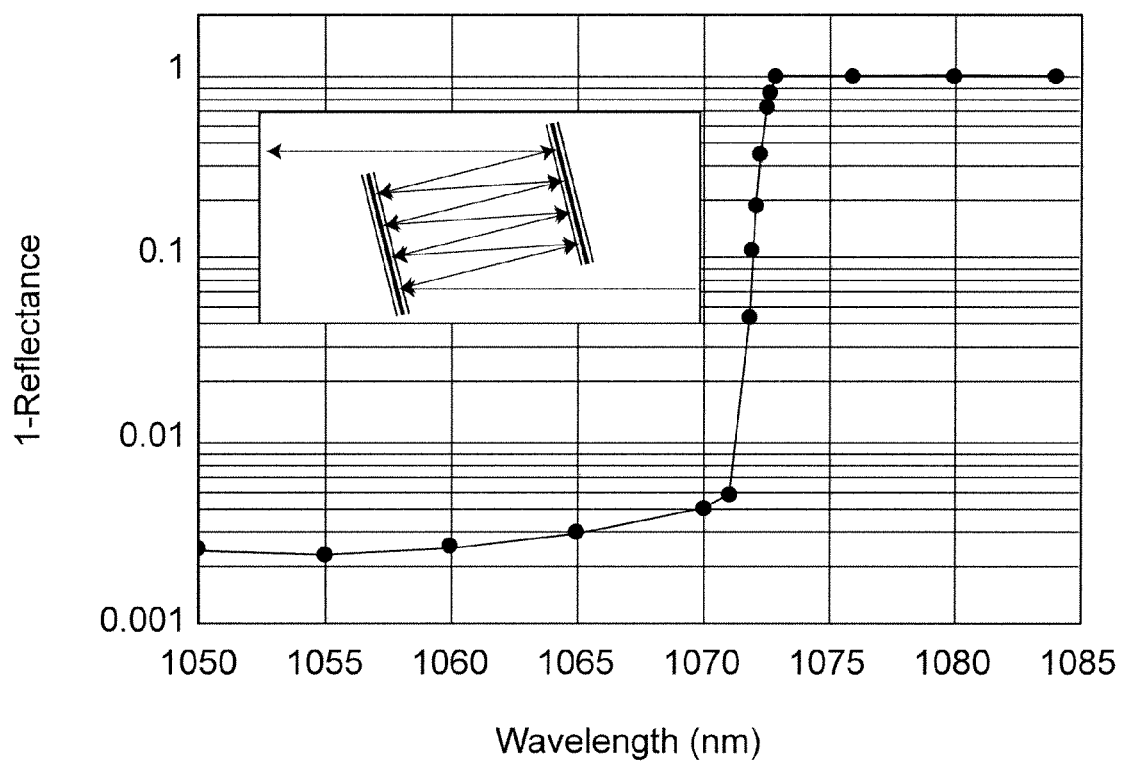
FIG. 5 is a plot of the reflectance versus wavelength for a filter formed of two opposing multilayer dielectric filters in accordance with an example.

A reflectance measurement setup using two MLD filters with an incident beam close to a normal-incident-angle is illustrated in the inset of FIG. 5, having a total number of 8 reflections. The reflectance was measured to be >99.7% at four wavelengths shorter than cutoff, i.e. 1050 nm, 1055 nm, 1060 nm, and 1065 nm. The high reflectance makes this filter ideal for the reflecting configuration. With the measured transmittance and reflectance of the sample filter, Expression (5) predicts that up to ~40 equal-power channels can be combined for an overall efficiency >90%, using the existing filter sample.

The MLD filters tested were manufactured by a process of ion-beam-sputtered coating with tested damage-fluence >1 J/cm2 (for 10-ns pulses) and >10 kW/cm2 average power density. Such high damage thresholds offer an exceptional energy and power scalability for combining both pulsed-amplifiers and CW-lasers. MLD filters in general are polarization-sensitive, meaning that the cut-off wavelengths for s- and p-polarization state are only the same at the designed working incident angle. The difference between the cutoffs of the two polarization-states increases gradually with a larger incident angle. This walk-off in the cutoff wavelengths is detrimental for the combining efficiency when combining non-polarized beam The maximum average combined power is ultimately limited by the thermal load and the surface damage of the combining filter elements. Thermal load comes from the residual absorption of the substrate or the multilayer coatings and will consequently heat up the filters and result in phase distortion of the combined beam. Using the heat absorption parameters provided by Jens Limped, et al., "The Rising Power of Fiber Lasers and Amplifiers", IEEE Journal of Selected Topics in Quantum Electronics, Vol. 13, No. 3, May/June 2007, pp. 537-545 (i.e., 10 ppm for anti-reflection coating, 0.7 ppm/mm for fused silica, 2 ppm for high reflection coating), one can estimate the heat on the last combiner filter, where the combined power is incident on. For the combiner filters in the transmission configuration 100, the heat load is generated by the absorption of the anti-reflection coating, glass substrate with 4-mm thickness assumed, and the high reflection coating, yielding a total thermal load of 0.37 W on the last combiner filter 118, assuming 25-kW combined power. On the other hand, for the combiners used in the reflection configuration 200, the heat is only generated by the absorption of the high reflection coating, giving a much lower thermal load of only 0.05 W. The heat load from either configuration should not constitute an issue and can be alleviated further, if desired, with proper cooling design on the combiner filter.

Having a larger beam size on the combiner will intuitively give lower thermal distortion on the wavefront of the beam, therefore, maintaining the beam quality at high power. The MLD filter configurations described herein are also advantageous over prior art grating-based beam combining systems because the former may be used with larger beam diameters. This also may facilitate use of high powered fiber lasers, whereas gratings did not, because with a larger beam diameter the incident fluence and intensity on the combining filters can be maintained well below damage thresholds, and without degrading the combined mode quality. Increasing the beam size in a grating applications would severely affect mode quality on the combined beam.

Figure 6:
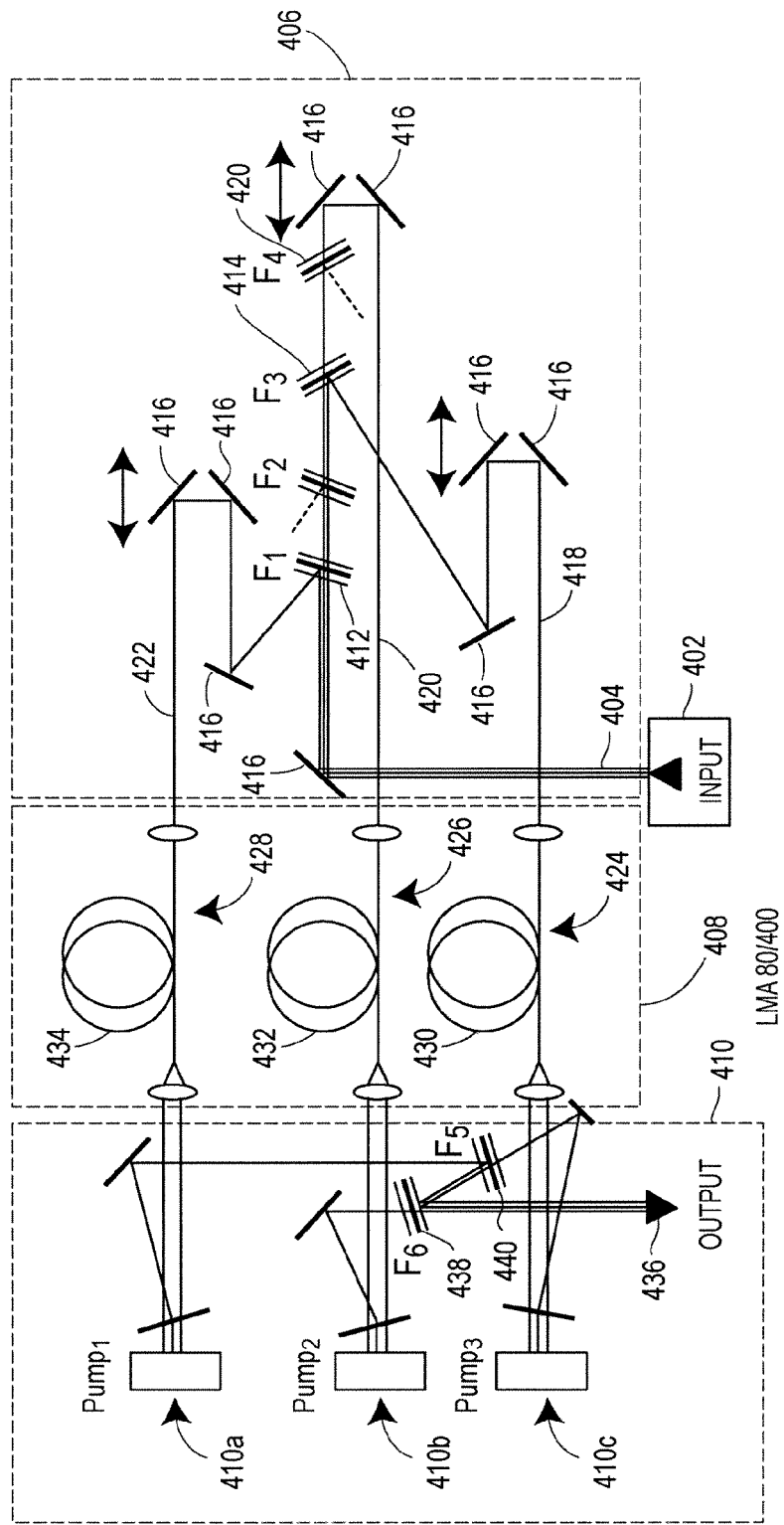
FIG. 6 illustrates a spectral non-dispersive beam combining apparatus with a single spectrally broad pulsed input laser beam, with a filter section for separating the input laser beam into spectrally distinct and spatially dispersive elements that are individually amplified and recombined to form a spatially non-dispersive output beam.

A compact, cost-effective spectral combining system employing the present techniques is illustrated in a Master Oscillator Power Amplifier (MOPA) configuration 400, shown in FIG. 6. Generally speaking, the design illustrates a compact high-power SBC laser architecture with only one fiber power amplification stage for each spectral channel-amplifier. In this case, that power amplification stage is a large-mode-area (LMA) fiber amplifier. All channel amplifiers in the system may be seeded from a common seed source, where the output from this seed source is distributed spectrally by the MLD filters (the same kind as those used in the combiners of FIGS. 2a and 2b), to seed the channel-amplifiers. This arrangement effectively reduces the overall system complexity since the duplication is only needed at the channel-amplifiers instead of having a whole multi-stage MOPA system for each individual channel.

The configuration 400 includes seed source 402. This source 402 may be any suitable laser or light beam source.

In one example implementation, the seed source 402 was formed from a four-stage MOPA having an electric-pulse-driven Fabry-Perot semiconductor laser diode emitting at the wavelength centered at 1057 nm. A seed pulse from the laser diode was pre-amplified by three stages of all monolithic, single-mode operating, polarization maintaining fiber amplifiers (two stages with telecom-graded components and one 30-μm LMA stage). The fourth stage was a free-space-coupled power amplifier with large-mode-area (LMA) fibers, amplifying the pulse to MW peak-powers by a 65-μm-diameter 0.06-NA core. Single-mode operation was achieved by careful mode-excitation and fiber-coiling, giving a measured beam quality factor of $M^2 \sim 1.05$ on the seed source beam from the source 402.

An input beam 404 from the seed laser source 402 is coupled to a filter section 406, a series of channel-amplifiers 408, and an output combiner stage 410. The laser source 402 produces a spectrally broad pulsed output beam. The filter section 406 uses two spectrum isolating filters. MLD filters 412 and 414, labeled $F_1$ and $F_3$, that spectrally divide the input beam 404 into three components, termed a "blue" component (i.e., a channel with the shortest wavelength), a "green" component, and a "red" component channels (i.e., a channel with the longest wavelength) for explanation purposes. That is, the filter section 406 converts the incident spectrally broad laser source into laser sources of smaller bandwidth, preferably corresponding to difference channel wavelengths for communication. The angle of incidence for each filter 412 and 414 is chosen to optimize the performance of a corresponding channel amplifier, in accordance to the wavelength-dependent gain of the $Yb^{3+}$ used in such amplifiers. Furthermore, different filter angles can be used to perform different average power and energy scaling and to adjust operation of the device 400 to different operating conditions, such as changes in operation due to temperature changes.

A series of mirrors (each labeled 416) are used to reflect the input beam 404 onto the filters 412 and 414, which then produce different spectral components (as shown) that are reflected off other mirrors 416 to produce the three different spectral component beams 418-422 which are coupled to one of three fiber amplifier stages 424-428.

Because these seeds 418-422 for the three channels are generated by splitting broad band spectrum input beam, the intrinsic spectral-domain profile of MLD filters (e.g., FIG. 4a) may result in the overlap of two adjacent seed channels, which will deteriorate the combining efficiency of combiner. Therefore, to truncate this overlapping additional spectral cleaning filters 418 ($F_2$) and 420 ($F_4$) have been introduced, to improve the combining efficiency while maintaining a small channel separation. By using a seed source that provides a sufficient seed power/energy, the resulting marginal loss in the seed power will not cause any degeneracy on power/energy extraction efficiency.

For the particular implementation, fiber laser amplifiers 430-434 were used for the stages 424-428. Each amplifier 430-434 was formed of a fiber core with an 80 μm diameter and 0.06-NA core. Where the fibers 430-434 are polarization preserving it will be desirable to use polarization-sensitive filters 412, 416, 414, and 420, aligned to couple a laser beam channel to the respective fiber amplifier stage 424-428.

Each amplified spectral component within the respective fiber is separately collimated to an $1/e^2$ diameter ~2 mm exit surface of the respective fiber and spectrally multiplexed with the combiner stage 410 using combining dielectric filters $F_5$ and $F_6$. Each stage 424-428 uses a pump source for fiber amplification. Edges of the spectral components in the combiner sage 410 are aligned for an optimum combining efficiency. To align the beams coaxially, a charge-coupled device (CCD) camera may be used to focus combined output beam 436 in the far field, for example, at the focus of a 200-mm plano-convex lens. Each of the stages in the combiner stage 410 includes three different delay line formed of mirror pairs and used to ensure temporal alignment of the spree separate beams. By using a pulsed input seed source 402, as opposed to a continuous wave (CW) source, temporal alignment particularly challenging. By embedding delay stages in the combiner stage of a single seed source beam apparatus, such temporal alignment can be achieved inherently. To provide further alignment, certain of the mirrors 416 can be translatable to decrease or increase stage delay. Either case, the resulting combined beam 436 may be a pulsed laser beam exhibit strong temporal overlapping.

As noted above, the present techniques may be used for high power, fiber laser applications. In some examples, pulses with a repetition rate of 100 kHz and durations of 2 ns were used to demonstrate power scalability. To help characterize the present combining techniques, combining efficiency was defined as the output power for each channel after the spectral combiner divided by the power in single polarization at the output of the channel-amplifier.

Figure 7:
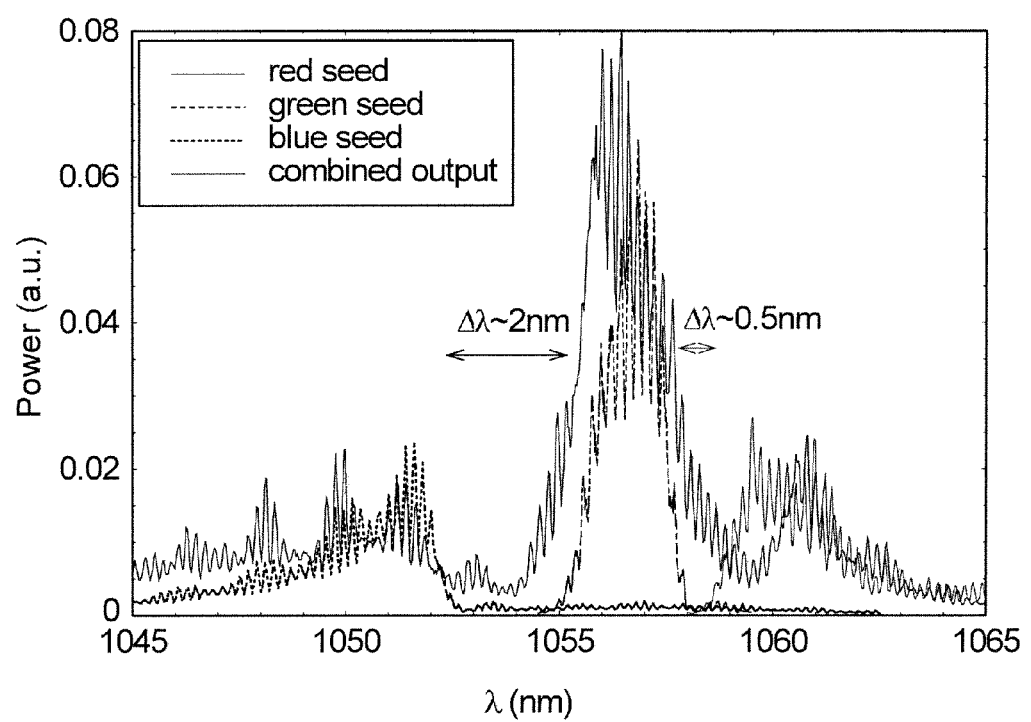
FIG. 7 is a plot of measured power performance for each of three seed beams produced by the filter section of FIG. 6 and for the combined output beam.

For the system 400, combiner MLD filters 438 and 440 and the MLD fitters 412 and 414 are angled to work with the s-polarization state of the input beam 404. The degree of polarization (DOP) of the input beam 404 was measured to be >99%. In the channel amplifiers 424-428 using careful mode excitation and fiber coiling, a DOP >84% was obtained at the highest available pump power. The combining efficiencies at the highest available pump power were measured to be 97% for the blue channel (stage 410a), 91% for the green channel (stage 410b), and 92.1% for the red channel (stage 410c). The total combined power was 52 W, limited by available pump power, corresponding to ~0.52 mJ and ~221 kW peak power per pulse. Lower combining efficiency for the green and the red channels were due to the ~5% transmission loss through the multilayer coating and the glass substrate. The demonstrated combining efficiencies were ~3% lower than the theoretical limit due to the slight spectral broadening in the channel amplifier stages 424-428. The spectra of the three seed channels and the output are plotted in FIG. 7, which shows that the channel separation was below 2 nm at the high combining efficiencies.

Figure 8:
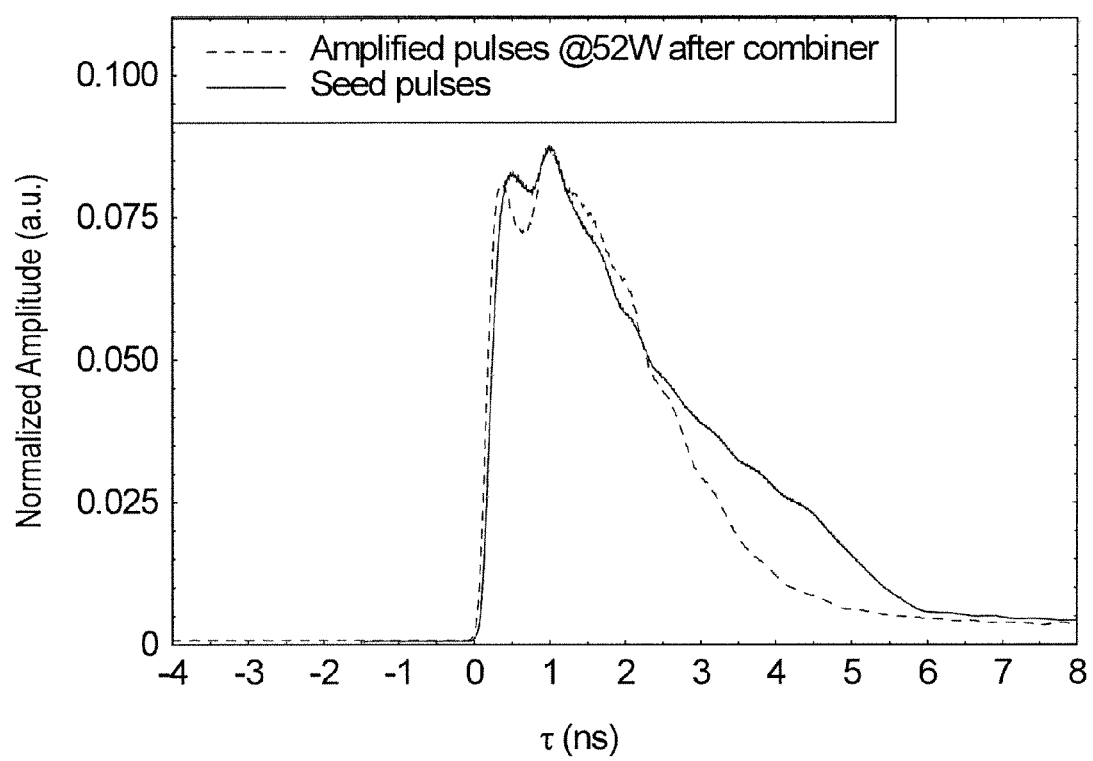
FIG. 8 is a plot of temporal profile of the combined output beam produced by the configuration of FIG. 6.
Figure 9A:
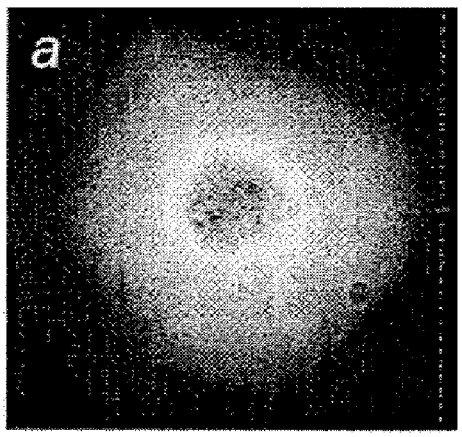
FIGS. 9a-9d illustrate far-field patterns for different seed beams and the combined output beam for the configuration of FIG. 6.
Figure 9B:
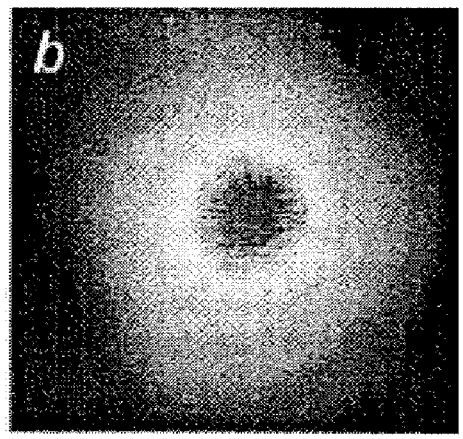
Figure 9C:
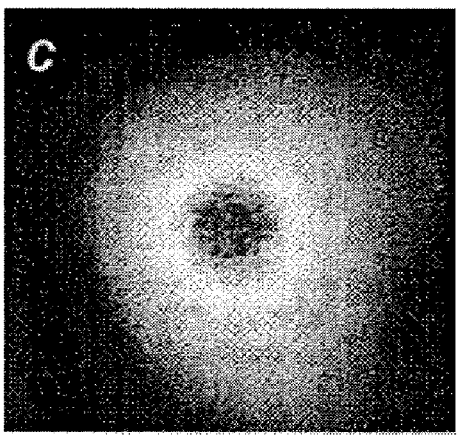
Figure 9D:
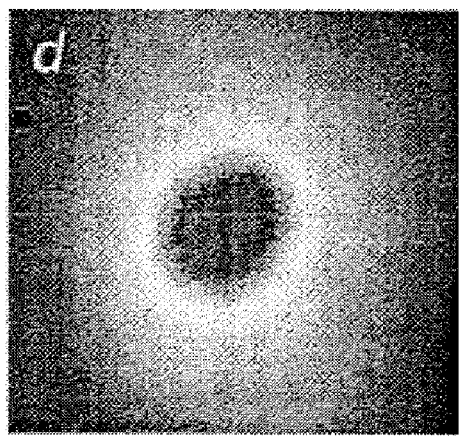

The temporal profile of the combined beam shows good overlapping (FIG. 8). The temporal property was measured by an InGaAs detector with a 150 ps rise time and an oscilloscope with a 40 GHz bandwidth. The resulting measurement shows no optical path differences at this resolution. Only a slight modulation in the temporal shape was noticed and that was believed to be due to the saturated gain in the channel amplifier stages 424-428.

Figure 10A:
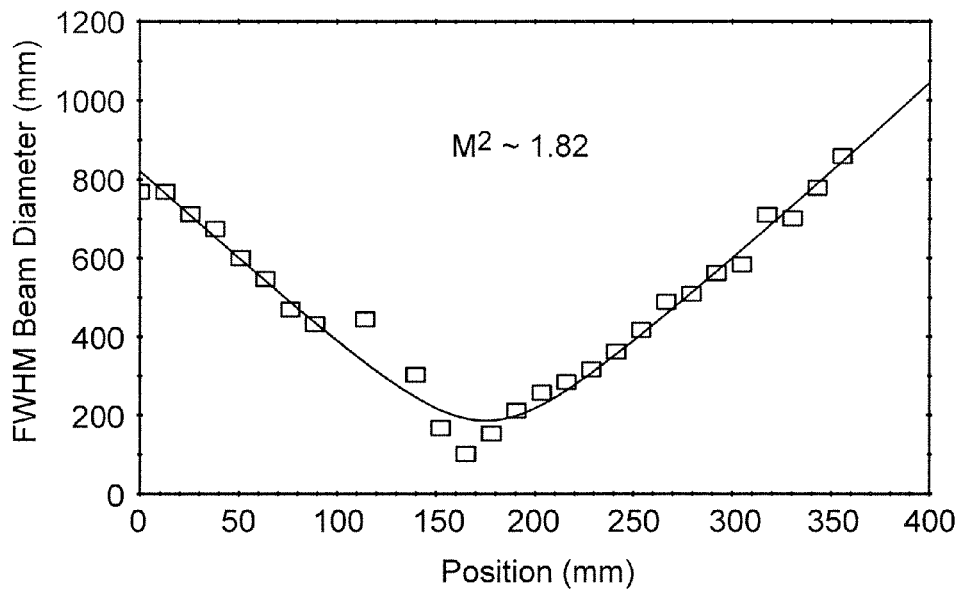
FIGS. 10a and 10b are plots of mode quality for a combined laser beam (position versus beam diameter) along a horizontal axis (FIG. 10a) and a vertical axis (FIG. 10b) in accordance with an example.
Figure 10B:
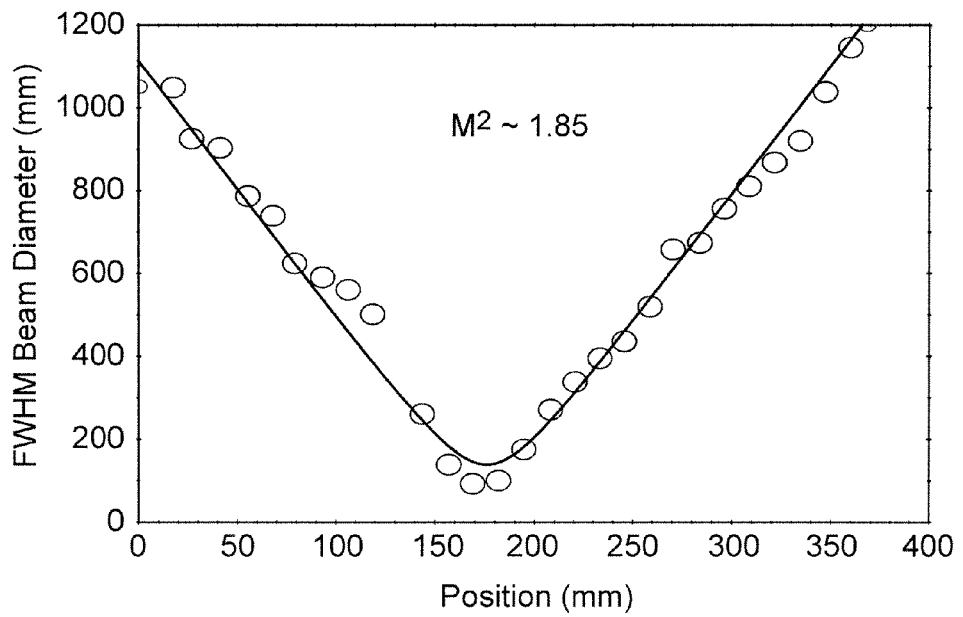

FIG. 9 shows the far-field output beam profiles for each individual channel after passing through combiner stage 410 and for the combined-beam 436 after the combiner stage 410. FIG. 9a shows the far-field pattern for the blue channel in this example, while FIG. 9b shows the far-field pattern for the green channel. FIG. 9c shows the far-field pattern for the red channel, and FIG. 9d shows the far-field pattern for the combined beam. The combined-beam intensity distribution shows that the pulsed beam qualities of each individual laser channel were preserved after the MLD filters despite the significantly broad spectral width of each channel. A mode quality of $M^2$~1.8 was measured for the combined beam as measured along the horizontal axis (FIG. 10a) and the vertical axis (FIG. 10b).

To examine energy scaling, another experiment was performed, this one using a configuration similar to that of system 400 but having different seed pulses for each blue, green, and red channel, in place of the single seed source and spectral filtering stages of FIG. 6. Each seed pulse comprised a longer pre-shaped pulse having a slow rising edge and FWHM durations of 6 ns at a repetition rate of 1 kHz. In the high pulse energy region, spectral broadening becomes detrimental for the combining efficiency since it will result in channel overlapping, therefore, the channel separation was increased to ~4 nm to minimize the channel overlapping due to spectral broadening.

In the last stage amplifier seeded with ~4 nm spectral-width input, the test produced ~38% of broadening on the FWHM spectral width due to four-wave-mixing when amplified to a peak power of 130 kW (1.11 mJ), and 76% of spectral broadening when amplified to 1.16 MW (5.09 mJ). The discrepancies between the peak power and the energy were due to the saturated-gain-induced temporal deformation. It was also noticed that the degree of polarization decreased from 82.5% at 1 mJ to 58% when the pulse was amplified to 3.6 mJ. The DOP degradation was attributable to the gain saturation of the fundamental mode, which has a saturation energy of 1.8 mJ for the fiber used. As a result, the higher order modes, possessing different polarization state from $LP_{01}$ mode, are amplified more beyond the saturation of the fundamental mode.

The seed energies used for the amplifiers are 250 μJ, 101 μJ and 495 μJ for the blue (B), the green (G), and the red (R) channels, respectively. Under the limitations of spectral broadening and degradation in DOP, only the highest combined energy before the combining efficiencies degenerated is reported. Amplified output energies of individual channels after the beam combiner were 1.25 mJ (B), 1.02 mJ (G) and 1.76 mJ (R), with combining efficiencies of 92% (B), 87% (G) and 92% (R), respectively. The combined beam had an energy of 4.03 mJ with peak power of 0.714 MW.

A spectral-beam-combining scheme using non-spatial-dispersive multilayer-dielectric filters is thus provided. The combining schemes impose no constraint on the laser linewidth and the beam-width to maintain the combined-beam mode-quality, in contrast to the prior art. The combining schemes are capable of use with many channels, as the number of channels is essentially limited only by the filter sharpness and efficiency. The combining schemes are ideal to work with lasers having simultaneous MW peak-power and multi-kW average-power since there exists no trade-off on the laser line-width and the beam-size. Example experimental results verified the effectiveness of the combining scheme using only three channels of spectrally-broad lasers, while additional channels provides even greater flexibility and operational control.

Figure 11:
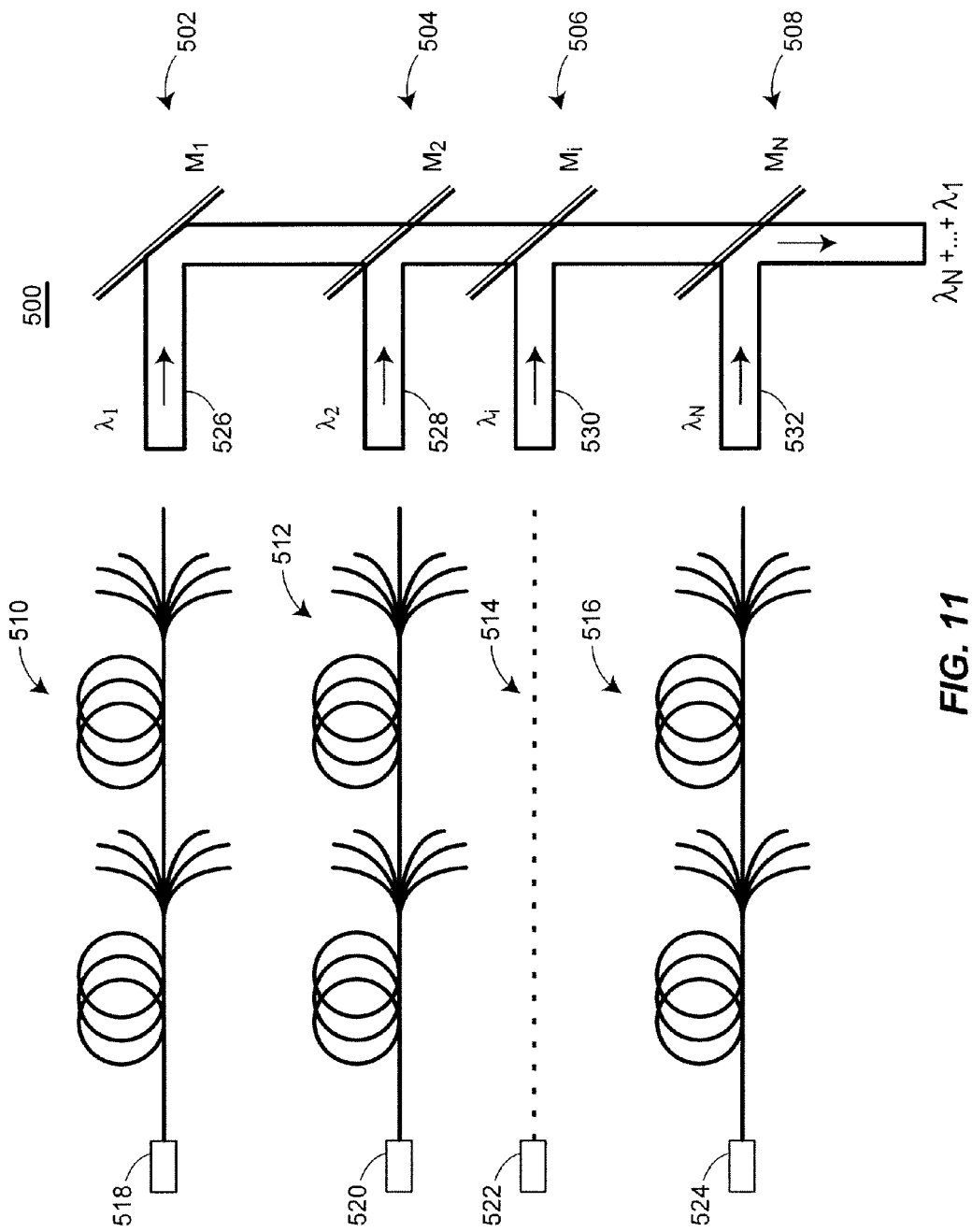
FIG. 11 illustrates a system for forming a spatial non-dispersive combined beam from a plurality of spatially dispersive separate pulsed fiber laser sources in accordance with an example.

A spectral-beam-combining techniques using non-spatial-dispersive MLD filters as described herein may be used in any number of different configurations. FIG. 11 illustrates a configuration 500 similar to that of configuration 100 shown in FIG. 2a. MLD filters having different special-domain profiles are illustrated and labeled according $M_1$-$M_N$ and each operate as a spatial dispersion-correcting device, one for each combining stage 502-508. Each stage 502-508 contains a fiber amplifier stage 510-516, respectively, that is fed by a seed light beam source 518-524, which may be coherent laser light although this need not be the case. Preferably the fiber amplifier stages 510-516 are Yb+-doped fiber amplifiers are and able to produce pulses of between about 10 W to 10 kW of power, over a wavelength of between 10 nm and 1100 nm, at pulse widths from below 1 ns to above 100 ns. To normalize the power levels of resulting light beams 526-532, each respective Yb-fiber amplifier 510-516 may be adjusted in length to produce a laser output that has a different intensity than the other laser outputs from the other stages. For example, the power of the laser output beams 526-532 may decrease, with $\lambda_1 > \lambda_2 > \lambda_i > \lambda_N$, which would compensate by increasing transmission loss experienced by the laser output beams 532-526, due to the beam $\lambda_1$ passing through more MLD filters than the $\lambda_N$.

Figure 12:
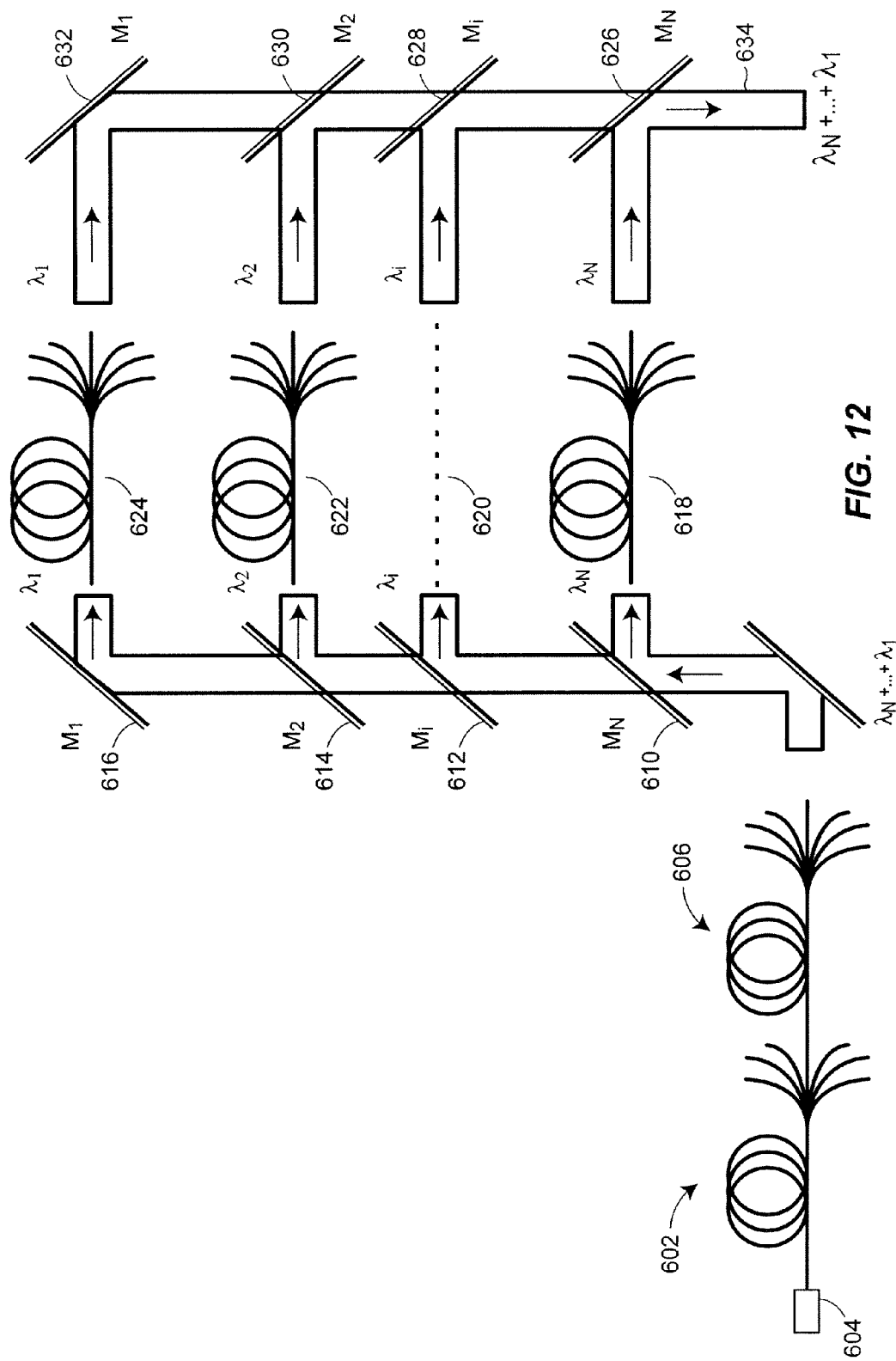
FIG. 12 illustrates a system for forming a spatial non-dispersive combined beam from a single broadband pulsed fiber laser source.

FIG. 12 illustrates another example spectral-combining system 600 but that uses a single seed laser with a broad bandwidth, similar to the system 400 of FIG. 6. An input light beam is produced by a fiber laser stage 602 having a seed diode 604 and a fiber amplifier 606. A broadband output from the laser stage 602 contains wavelengths corresponding to all channel wavelengths, $\lambda_1 + \lambda_2 + \ldots \lambda_N$. A reflector 608 couples the output beam into a plurality of filter stages 610 ($M_N$)-616 ($M_1$), each filtering that output beam into one of its constituent spectral channels, corresponding to wavelengths $\lambda_N \ldots \lambda_2$, $\lambda_1$, respectively. Each of these spectral channels may correspond to a laser channel of an multiple-channel optical communication system or protocol. Each of these spectral channels may be individually amplified using dedicated fiber amplifier stages 618-624. The amplified channels from each amplifier stage 618-624 are the combined using a transmission MLD filter configuration formed of MLD filters 626-632 that collectively produce a combined beam 634.

Figure 13:
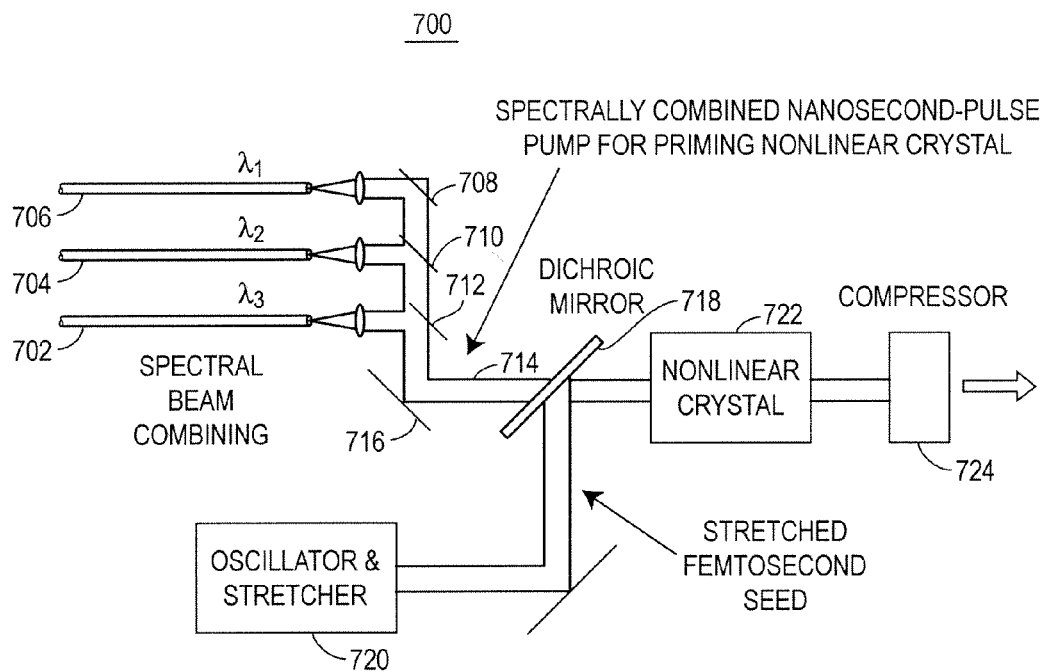
FIG. 13 illustrates an optical chirped pulsed amplification system in accordance with the examples herein.

The beam combining techniques may be used in an optical chirped pulse amplification (OPCPA) system 700 as shown in FIG. 13. Three input pulsed fiber laser stages 702-706 are illustrated, each producing a laser output at a different channel wavelength. These laser outputs are combined by MLD filters 708, 710, and 712, which are in a transmission configuration. Spatially non-dispersive, combined beam 714 is reflected by a first reflector 716 onto dichroic mirror 718 such that the beam 714 is made to operate as a nanosecond laser pulse pump beam for pumping a nonlinear crystal. The beam 714 for example have a pulse width of between 10 ps to 3 ns, a peak power of between 10 W and 50 kW and an energy level of 100 µj to 10 mJ. This is a first pump beam. A second, stretched femtoseconds seed beam is produced by another laser source, i.e., an oscillator and stretcher 720. Beams from each source are combined in a nonlinear crystal 722 (e.g., a birefringent crystal such as $\beta$-$BaB_2O_4$ (BBO), $LiNbO_3$, and $MgF_2$, etc. or periodically pulsed materials such PPLN (periodically poled Lithium Niobate), PPLT (periodically poled Lithium Tantalate), PPRTA (periodically poled Rubidium Titanyl Arsenate (RTA)), PPKTP (periodically poled Potassium Titanyl Phosphate (KTP)), etc.) and produce a parametric amplified light beam at a down-converted wavelength, which is then provided to a compressor 724.

Extreme ultraviolet lithography (EUVL) is currently a primary technology for extending optical lithography below 32 nm half pitch. However, development of production-worthy EUV radiation sources has been one of the key challenges of implementing EUVL. EUV radiation is generated by hot plasma produced by high-intensity laser light. For high throughput lithography systems at least 200 W of 13.4 nm radiation at intermediate focus is required. Due to the inherently low efficiency of EUV radiation from hot plasmas this translates to very high laser-driver average power, which can be as high as 25 kW.

Figure 14:
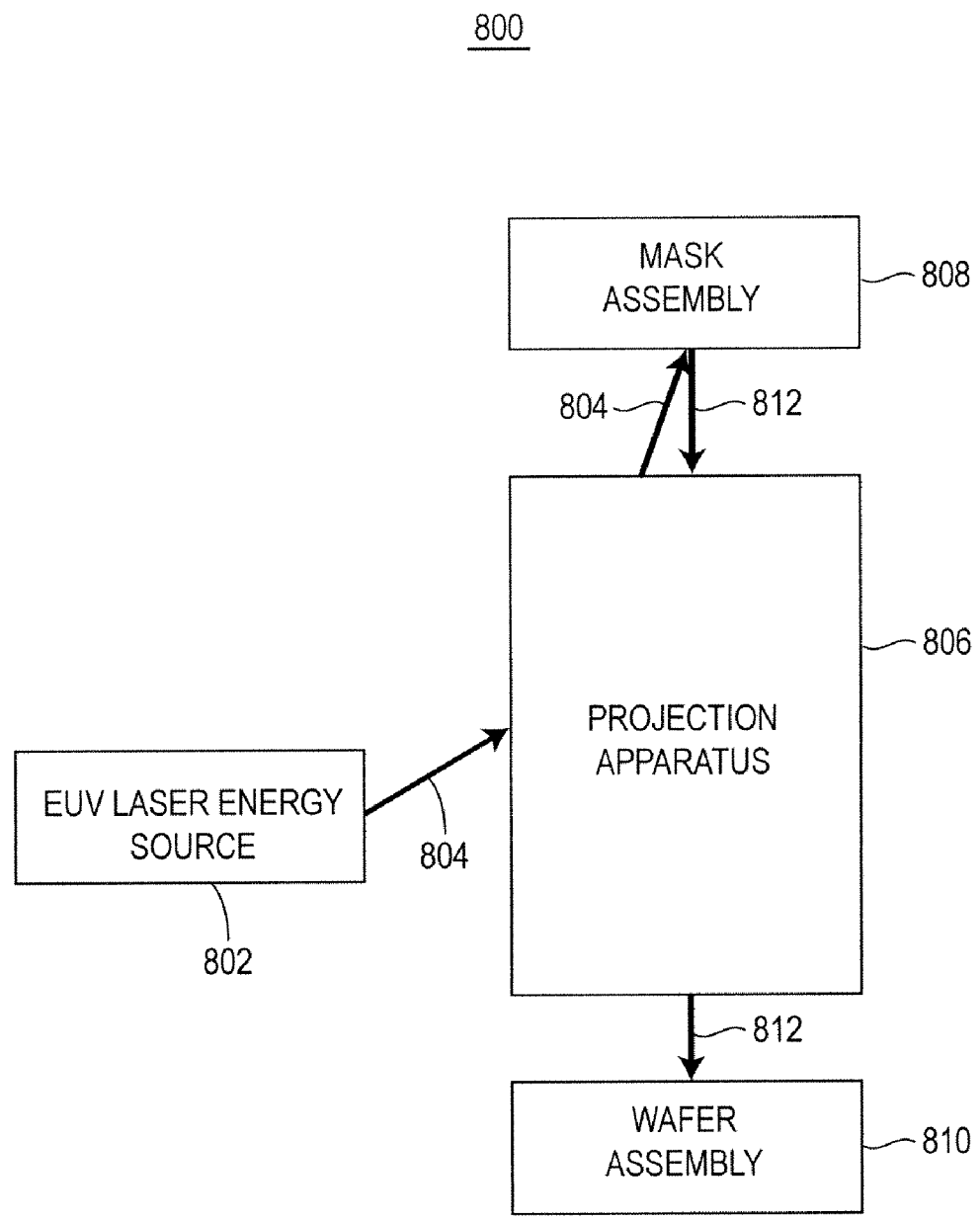
FIG. 14 illustrates an extreme ultraviolet lithography system using a spatially non-dispersive beam combining system in accordance with the examples described herein.

FIG. 14 illustrates an EUVL system 800 using a fiber laser beam combining source 802, such as a laser source in accordance with any of the examples described herein, including those of FIG. 6, 11, or 12. The fiber laser source 802 is an EUV energy source producing a high peak power, spatially non-dispersive output beam 804 that is coupled to a projection apparatus 806. The projection apparatus 806 is optically coupled between a mask assembly 808 and a wafer assembly 810 and directs the EUV beam 804 onto the mask assembly 808 and then directs a resulting illumination patterned beam 812 from the mask assembly 808 onto the wafer layer 810 to form patterned structures therein, e.g., semiconductor structures. The EUV laser source 802 produces 13.5 nm EUV energy, and the system 800 may be contained in vacuum for efficient operation. The projection apparatus 806 is implemented with focusing elements, e.g., condenser and projection multilayer mirrors, that are compatible with EUV energy sources. Due to inherent absorption over the EUV range, high peak power is needed, e.g., above approximately 25 kW. While a mask is shown, in other examples EUV laser sources may be implemented using maskless interference lithography configuration.

Using fiber lasers as the illumination source for the EUVL system 800 may offer advantages, because this laser technology is power scalable, highly efficient, compact and very reliable. Conventionally, there are limitations to using fiber lasers as EUV radiation sources. The present techniques, however, offering fiber laser beam combining configurations that form spatially non-dispersive EUV beams.

For the illustrated system the EUV laser source 802 may be formed a series of fiber laser stages (i) each capable of producing optical pulses with sufficiently high energy and peak power, and suitably short duration (e.g., 2 ns-6 ns pulses with at least ~1 MW peak power and at least 5 mJ-6 mJ energy), (ii) each operating at repetition rates compatible with practical sources such as Sn-droplet sources (estimated maximum droplet rate is 80 kHz to 100 kHz), and (iii) each having an average-power scalable to at least 20 kW, with potential for even higher average powers. The laser stages produce these laser beams which are spectrally multiplexed into multimodular blocks with a single-beam output that is the EUV beam 804. These spectrally-combined beams can be, if needed for further power scaling, spatially-multiplexed onto a droplet target. This modular architecture allows overcoming the main technological trade-off between the limited pulse energy achievable with a single fiber (to <10 mJ for pulse durations required for efficient laser-plasma EUV generation) and droplet-source limited repetition rate (to below 100 kHz). We had shown that optimum EUV conversion efficiency can be achieved with ~5 ns pulses. At the present, practical high-energy Yb-doped fibers have maximum core sizes of 50 µm-80 µm, which sets the maximum energy for these pulse durations at around 5 mJ-6 mJ. Consequently, pulse repetition rate limitation of <100 kHz means that the maximum average-power achievable with a single-fiber system is limited to approximately 500 W, in such examples. Multiple fibers avoid single fiber limitations. For example, using ultra-sharp and tunable spectral-domain transmission profiles on the spectrally-dispersive correcting filters allows achieving ~2 nm spectral separation between the channels, which in conjunction with measured >99.7% reflectivity of the MLD filters is sufficient for combining of up to 40 laser sources with the total efficiency of >90%. Consequently, combining 10 to 40 single-fiber modules of up to ~500 W each can lead to spectrally-combined optical powers in the 5 kW to <20 kW range for EUVL operation.

Figure 15:
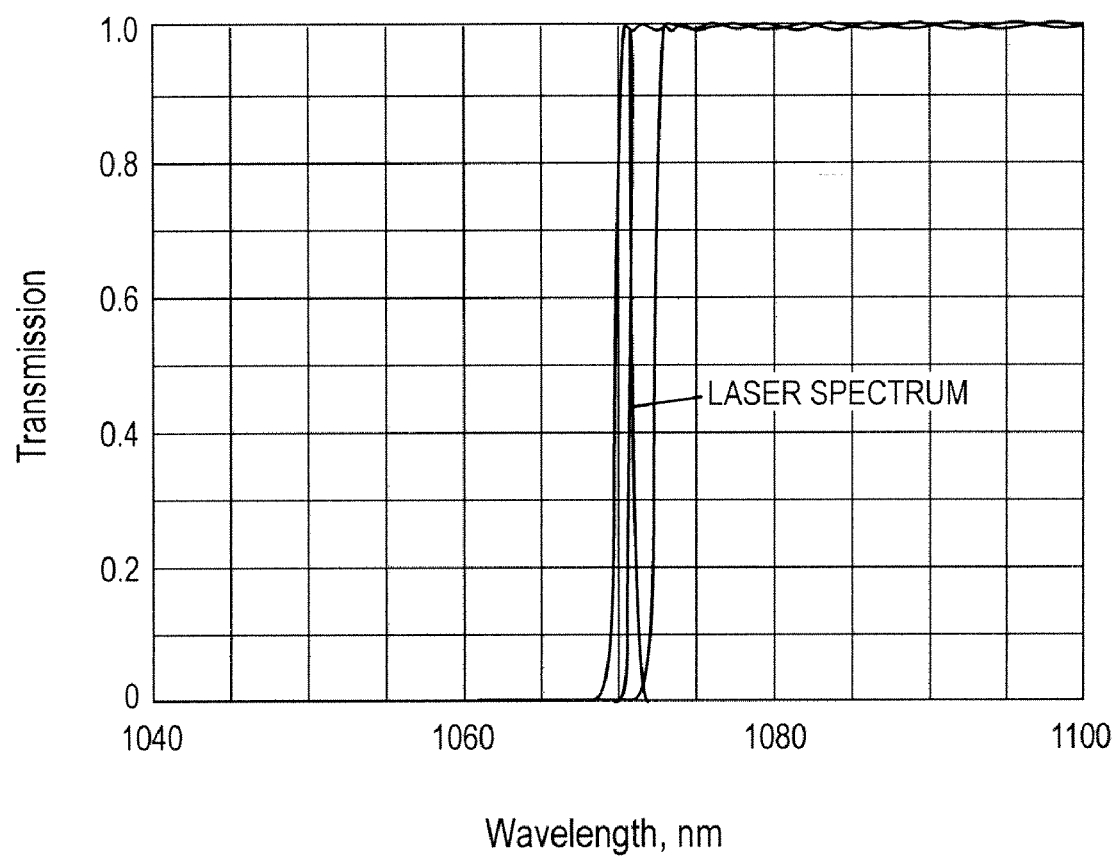
FIG. 15 is a plot of wavelength versus transmission of a laser channel through a spatial dispersion correcting filter in the form of a spectral window formed by two subsequent sharp-edge filters used in a combining element, in accordance with an example.
Figure 16:
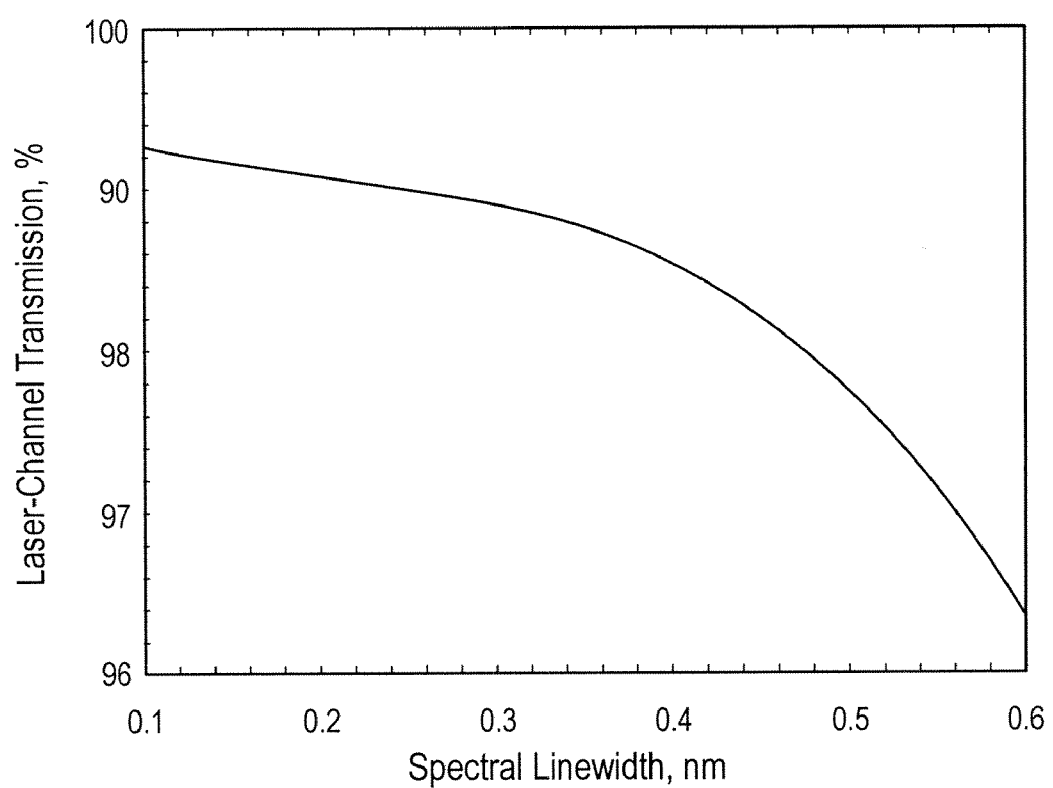
FIG. 16 is a plot of spectral linewidth versus laser channel transmission in accordance with the example of FIG. 15.
Figure 17:
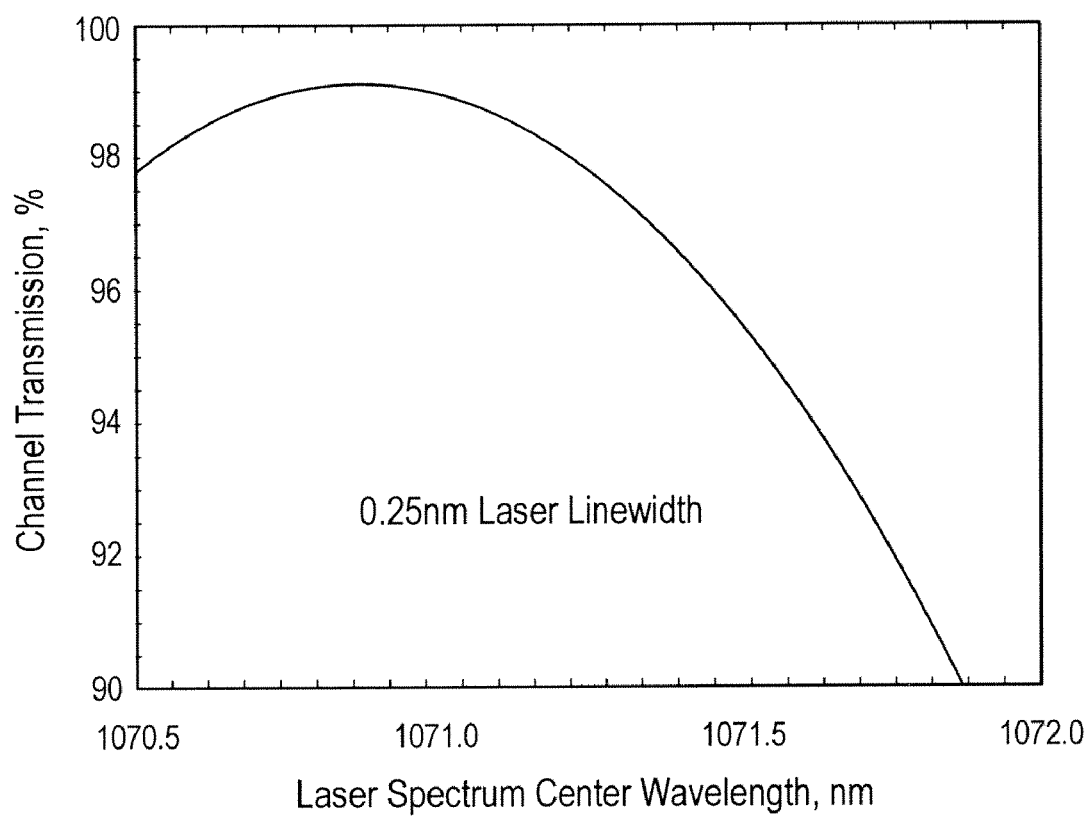
FIG. 17 is a plot of channel transmission versus laser spectrum center wavelength in according with the example of FIG. 15.

In some spectral combining schemes, precise tailoring of the spectral content of each of the combined laser sources is quite important. Indeed, the spectral content of each laser source (or channel) should match the spectral "window" provided by two spectrally-subsequent combining elements in order to achieve high overall combining efficiency with a large number of laser channels. This can be seen in the FIG. 15, which shows the transmission efficiency of a laser channel through a spectral window formed by two subsequent sharp-edge filters used as a combining element example. In this particular case, the spectral combining "window" is formed by two transmission "edges" (FIG. 15 representing experimentally measured data) of the two filters that are shifted with respect to each other by ~2.5 nm. An example of a laser channel with 0.25 nm bandwidth centered at 1070.84 nm is shown in this figure. FIG. 16 shows individual-channel transmission efficiency as a function of laser-channel spectral width. FIG. 17 shows this efficiency as a function of exact laser-channel spectral position. From FIG. 15 one can see that in order to maintain each-channel efficiency of >99.7% (e.g., to achieving >90% overall combining efficiency with >40 laser channels) spectral width of each laser channel has to be <0.1 nm and central-wavelength should be position with better than ±0.1 nm accuracy. From this example it is clear that the requirements for spectral characteristics of each laser channel are very tight and it is challenging to achieve a practical system with such tight parameters.

There are two general methods to tailor the spectral characteristics of the seed laser sources: (i) passive methods when no active feedback is used to define seed laser diode spectral characteristics, and (ii) passive methods, when s certain type of optical signal is used to actively control spectral content of each laser channel.

One implementation of the passive seed-diode spectral control can be implemented as described in the current disclosure, with spectral slicing before power amplification stage, such as in the example of FIG. 6 or 12.

Another implementation of passive seed-diode spectral shaping can be achieved by using fiber Bragg gratings connected to the output of each of the seed diodes. Fiber grating provides an optical feedback at a specified wavelength, thus effectively setting the diode operational wavelength.

More flexible approaches are based on active laser-diode wavelength control. Broadly this approach is based on so-called injection-locking technique. In this technique, a low-power and narrow-linewidth optical signal within the gain spectrum of the seed-diode is injected into a seed-diode cavity thus forcing it to operate at a single longitudinal mode at precisely the injection wavelength. Two examples are described. First, injection-locking can be performed on each seed diode using an individual cw injection lasers with individually tunable wavelength. Second, injection-locking can be performed on each seed diode using a broad-band cw continuum source (e.g. ASE source covering all the relevant gain spectrum) where each-channel feedback is produced by "slicing" from this broad spectrum tunable and narrow-linewidth in-fiber filters. The configuration would thus be similar to that of FIG. 12. In a system implementation a broad band "master" source could be constructed as a single fiber system, whose output is split into a number of parallel paths (number of paths is equal to the number of combined-laser channels in the system). This splitting, for example, can be achieved by using all-fiber 1:N optical couplers. Each optical path would contain a fiber-pigtailed narrow-pass fiber pigtailed tunable-wavelength filter. The tuning could be tailored using the output of a combined system as a feedback signal, such that transmission of each individual laser channel is maximized. Such filters can be implemented using known techniques by, for example, fiber-pigtailing multi-layer dielectric narrow-bandpass filters, or, alternatively, using tunable fiber grating filters.

Alternatively, this injection-locking can be achieved by using only a fraction of a spectrally combined overall system output. Small fraction of the total power could be coupled into a monitoring optical fiber, which then would serve as a broad-band injection-locking signal in a manner similar as described in above. This would include fiber-optic 1:N splitter, and narrow-pass tunable filters to select each corresponding channel wavelength.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. An apparatus for forming a spatially non-dispersive beam, the apparatus comprising:
   a plurality of pulsed laser sources, each laser source is to produce a pulsed laser beam at a different wavelength where each pulsed laser beam has a peak power of above 0.5 kW, and where each pulsed laser beam is spatially dispersed from the other pulsed laser beams; and
   a beam combiner apparatus having a plurality of spatial dispersion-correcting stages one for each of the pulsed laser beams, where each spatial dispersion-correcting stage is tuned to transmit and reflect incident light using a different spatial-domain transmission profile from the other spatial dispersion-correcting stages, where the spatial dispersion-correcting stages are configured to combine the pulsed laser beams along a propagation path in a wavelength-independent manner by removing the spatial dispersion from the pulsed laser beams and in a temporally synchronized manner to produce the spatial non-dispersive beam as a combined pulsed output beam from the beam combiner apparatus, the spatial non-dispersive beam having a spectral profile that spans the different wavelengths of the pulsed laser beams and having a peak power that is proportional to a combined peak power of the pulsed laser beams.

2. The apparatus of claim 1, wherein each of the plurality of pulsed laser sources comprises a feed light source and a fiber amplifier stage configured to produce the pulsed laser beam having a pulse width that is below 100 ns.

3. The apparatus of claim 1, wherein each of the spatial dispersion-correcting stages comprises a coupling filter, such that each of the plurality of laser sources is aligned with a coupling filter.

4. The apparatus of claim 3, wherein coupling filters are multilayer dielectric filters.

5. The apparatus of claim 4, wherein the multilayer dielectric filters are in a transmission configuration where incident light from the laser source aligned with the multilayer dielectric filter is reflected from the multilayer dielectric filter and light from other multilayer dielectric filters is transmitted through the multilayer dielectric filter.

6. The apparatus of claim 4, wherein the multilayer dielectric filters are in a reflection configuration where incident light from the laser source aligned with the multilayer dielectric filter is transmitted through the multilayer dielectric filter and light from other multilayer dielectric filters is reflected from the multilayer dielectric filter.

7. The apparatus of claim 4, wherein each of the multilayer dielectric filters is angle-tuned to have a different spatial-domain transmission profile.

8. The apparatus of claim 4, wherein each of the multilayer dielectric filters are made of different materials to result in the different spectral-domain transmittance profiles on each of the multilayer dielectric filters.

9. The apparatus of claim 4, wherein each of the multilayer dielectric filters has a reflectance or transmittance value such that the apparatus having at least 20 spatial dispersion-correcting stages and at least 20 pulsed laser sources will produce the spatial non-dispersive beam with a combining efficiency of 90% or greater.

10. The apparatus of claim 4, wherein the apparatus has at least 40 coupling filters and at least 40 pulsed laser sources.

11. The apparatus of claim 4, wherein each multilayer dielectric filter has a spatial-domain transmission profile with an edge transition of less than 1 nm, wherein the edge transition is measured between 10% transmission and 90% transmission for a particular incident wavelength.

12. The apparatus of claim 1, wherein the plurality of pulsed laser sources comprise;
   a single pulsed fiber laser source producing a spectrally broad pulsed output beam; and
   a plurality of spatially dispersed filter stages each converting at least portion of the spectrally broad pulsed output beam into one of the pulsed laser beams at different wavelengths.

13. The apparatus of claim 12, wherein the plurality of pulsed laser sources further comprises a different fiber amplifier stage for each of the plurality of spatially dispersed filter stages.

14. The apparatus of claim 1, wherein the spatial non-dispersive beam has peak power of between 5 to 20 kW and an energy of about 5 to 10 mJ.

15. A method of forming a spatially non-dispersive beam, the method comprising:
   producing a plurality of pulsed laser beams, each laser beam is at a different wavelength from the other laser beams and each has a peak power of above 0.5 kW, wherein the laser beams are spatially dispersed from one another; and
   coupling the laser beams through a plurality of spatial dispersion-correcting stages one for each of the laser beams, where each spatial dispersion-correcting stage is tuned to transmit and reflect incident light using a different spatial-domain transmission profile from the other spatial dispersion-correcting stages, where the spatial dispersion-correcting stages are configured to combine the pulsed laser beams along a propagation path in a wavelengths-independent manner by removing the spatial dispersion from the pulsed laser beams and in a temporally synchronized manner to produce the spatial non-dispersive beam as a combined pulsed output beam from the beam combiner apparatus, the spatial non-dispersive beam having a spectral profile that spans the different wavelengths of the pulsed laser beams and having a peak power that is proportional to a combined peak power of the pulsed laser beams.

* * * * *